United States Patent [19]
Beal et al.

[11] Patent Number: 5,155,845
[45] Date of Patent: Oct. 13, 1992

[54] DATA STORAGE SYSTEM FOR PROVIDING REDUNDANT COPIES OF DATA ON DIFFERENT DISK DRIVES

[75] Inventors: David G. Beal, Longmont; Fred C. Eifert, Louisville; Henry S. Ludlam, Longmont; Charles A. Milligan, Golden; George A. Rudeseal, Boulder; Paul R. Swiatek, Lafayette, all of Colo.

[73] Assignee: Storage Technology Corporation, Louisville, Colo.

[21] Appl. No.: 538,911

[22] Filed: Jun. 15, 1990

[51] Int. Cl.⁵ .................. G06F 11/20; G06F 13/00
[52] U.S. Cl. .................. 395/575; 364/DIG. 1; 364/245.3; 364/268.5; 371/10.1
[58] Field of Search ............ 371/10.1, 9.1, 11.1; 364/245.3, 268.5; 395/575

[56] References Cited

U.S. PATENT DOCUMENTS

| | | | |
|---|---|---|---|
| 3,581,286 | 5/1971 | Beausoleil | 364/200 |
| 3,725,864 | 4/1973 | Clark et al. | 364/200 |
| 3,964,056 | 6/1976 | Charpentier et al. | 364/200 |
| 4,342,079 | 7/1982 | Stewart et al. | 364/200 |
| 4,779,189 | 10/1988 | Legvold et al. | 364/200 |
| 4,837,680 | 6/1989 | Crockett et al. | 364/200 |
| 4,862,411 | 8/1989 | Dishon et al. | 364/952 |
| 4,897,781 | 1/1990 | Chang et al. | 364/200 |
| 4,897,782 | 1/1990 | Bennett et al. | 364/200 |
| 4,958,273 | 9/1990 | Anderson et al. | 364/200 |
| 5,051,887 | 9/1991 | Berger et al. | 364/200 |

FOREIGN PATENT DOCUMENTS

| | | |
|---|---|---|
| 0109981 | 6/1984 | European Pat. Off. |
| 0239323 | 9/1987 | European Pat. Off. |
| 0299511 | 1/1989 | European Pat. Off. |
| 0303856 | 2/1989 | European Pat. Off. |
| 0352028 | 1/1990 | European Pat. Off. |
| WO82/02784 | 8/1982 | PCT Int'l Appl. |
| WO85/02926 | 7/1985 | PCT Int'l Appl. |

OTHER PUBLICATIONS

Dishon, Disk Dual Copy Methods and Their Performance, FTCS-18 Digest of Papers, Jun. 1988, Tokyo, Japan, pp. 314-319.

Control System of Main Storage Device, Patent Abstracts of Japan, vol. 006, No. 206 (P-149) Oct. 19, 1982, JP 57 111,900.

Frush, Graceful Degradation in a Multiple Data Path Environment, IBM Tech. Discl. Bulletin, vol. 16, No. 3, Aug. 1973, pp. 912-914.

*Primary Examiner*—Charles E. Atkinson
*Attorney, Agent, or Firm*—Dorr, Cason, Sloan & Peterson

[57] ABSTRACT

A disk storage system that writes multiple copies of records directed to user-specified volumes. A plurality of spaced apart control units interconnected by direct data links and a corresponding plurality of sets of recording means communicate over the direct data links when a write request is received by one control unit to cause one volume in each set of recording means to write a copy of the received record.

71 Claims, 16 Drawing Sheets

FIG. 15. DEFINE EXTENT PARAMETER LIST

| 0 | 1 | 2 | 3 | 4 | 5 | 6 | 7 |
|---|---|---|---|---|---|---|---|
| MB X'9C' | GA X'E4' | BLS 0000 | CFW 'ID 00 | 0 | — | BEX ADD CE.CYL | EEX ADD CE.CYL |

FIG. 16. LOCATE RECORD PARAMETER LIST

| 0 | 1 | 2 | 3 | 4 | 5 | 6 | 7 |
|---|---|---|---|---|---|---|---|
| OB X'01' | AB X'00' | 0 | COUNT X'01' | SADD CE.CYL | SARG X'C5C3C1D4FF' | S# X'00' | TLF X'FFFF' |

FIG. 17. REQUEST PACKET

| 0 | 1 | 2 | 3-0 | 3-i | 3-n | 4 |
|---|---|---|---|---|---|---|
| MSG ID MECG | REQUEST TYPE ESTB | LV 3 | RV0 | ----- | RVn | MESSAGE COMPLETION STATUS |

FIG. 20.

| ACKNOWLEDGEMENT/ REFUSAL | GROUP ID | RETURN CODE |
|---|---|---|
| | | ACK/ REFUSAL CODE |
| 0 | 1 | 2 |

| PERFORM DEBEVAGE OR READ FROM BEVY REQUEST OR READY TO RECEIVE DATA OR READ FROM BEVY COMPLETE | GRP ID | TRACK ID | CACHE RECORD DESCRIPTION |
|---|---|---|---|
| | | DCCHH | |
| 0 | 1 | 2 | |

2)

| MODIFIED FIELD INDICATOR | INTERNAL RECORD # | KEY OFFSET | DATA OFFSET | DASD SEGMENT # | RECORD LOGICAL ID | | |
|---|---|---|---|---|---|---|---|
| | | | | | CCHHR | KEY LENGTH | DATA LENGTH |
| 3 | 4 | 5 | 6 | 7 | 8 | 9 | 10 |

DATA STORAGE SYSTEM FOR PROVIDING REDUNDANT COPIES OF DATA ON DIFFERENT DISK DRIVES

FIELD OF THE INVENTION

This invention relates to a data storage system and, in particular, to an improved facility for providing redundant copies of data records. This invention further relates to a data storage system of the DASD (direct access storage device) type which responds to a host processor write request to provide multiple copies of a data record on separate disk drives of separate DASD subsystems. The invention still further relates to a DASD type system wherein each subsystem controller includes a cache memory for the provision of cached read and write operations on multiple copy service.

BACKGROUND OF THE INVENTION

Peripheral data storage subsystems of the DASD type utilizing magnetic disk units and the like are known for writing and reading data records under control of one or more connected host processors. With the high reliability of present-day DASD subsystems it is an acceptable business risk for many users to employ DASD facilities that maintain only a single copy of each stored record. However, some users require increased protection for some of their data against the loss of data availability that would result from a failure of a DASD subsystem element such as, for example, a disk device. Although the facilities needed to provide a higher degree of data availability are clearly more expensive, it is, in some circumstances, an acceptable cost to businesses. Examples of such business are banks where the stored data may comprise financial records and airlines where the data may represent reservation information. In such businesses, the necessity for the greatest possible protection from data loss is such that the concomitant increased cost is acceptable.

It is known to provide equipment which writes a separate copy of data records on a plurality of disk devices. Such an arrangement is shown in U.S. Pat. No. 4,837,680 of Jun. 6, 1989, to Robert N. Crockett et al. In this patent, a DASD subsystem having a plurality of disk drives and a single storage control provides dual copies of each record written by a connected host on a specified volume. The host generates a system command which causes all records subsequently written to a volume specified by the host to be written by the storage control onto two different disk drives. While the Crockett et al. system provides for continued data availability if one disk drive becomes unreadable, the system is vulnerable in that the failure of the storage control itself would cause the data on all disks served by the storage control to be unavailable to the host. Thus, while the Crockett system provides improved data availability, it is still subject to failure in the event that an element common to all disk units becomes unavailable. U.S. Pat. No. 4,862,411 of Aug. 29, 1989, to Dishon et al. shows an alternative arrangement for providing dual copies in a manner that avoids some of the disadvantages of Crockett. Although Dishon solves the single failure problem of Crockett, it has a number of disadvantages which render it less than ideal for many purposes. First of all, it is a requirement in known CKD (Count Key Data) DASD systems that the distance between the host processor and the disk control units cannot exceed approximately 240 meters and that the distance from the disk control unit to the disk drive controller cannot exceed approximately 60 meters. This presents a problem for Dishon for installation where the distance between the CPU 10 and the disk drive controller 42 already approximates the under 300 meter limit. In this case, the increased distance of communication path 34 extending to the disk drive controller 44 of the other control unit 18 may cause the total distance between CPU 10 and disk drives 48 to exceed the 300 meter limit. In this case, the Dishon et al. system would be unsuitable unless the second DASD control unit 18 is placed immediately adjacent to the first control unit 16. In any event, Dishon cannot be used for installations in which the disk drive controller 44 of the second control unit 18 must be positioned more than 60 meters from the first control unit 16. This distance is small when considering protection of one copy of data from the same hazard as could affect the first—e.g., fire, flood, terrorism.

Another disadvantage of the Dishon et al. system is that it does not contain cache memories and therefore does not provide the performance advantages of DASD control units that do contain cache memories. There would be an inherent difficulty in operating the Dishon system with cache memories since he provides no means of storing duplicate copies of a modified record in both cache memories (as is required for data integrity in cached write operations.) Thus, even if the two DASD control units 16 and 18 of Dishon were immediately adjacent to each other so as to present no distance problem, there would still be no effective way to provide cached read and cached write service in the Dishon system.

It is also known to provide dual copy service by connecting a host to separate DASD subsystems and by having the host apply separate write commands to each subsystem which writes the data record to a volume specified by the host. While this arrangement provides dual copy service and the enhanced data availability resulting therefrom, it is operationally undesirable in that it requires separate host write commands, and an increased utilization of host CPU time, to provide the dual copy service. An example of equipment that uses two host write operations to provide dual copy service is the Tandem Computer Non-Stop Fault-Tolerant Transaction Processing System. A second system operating in a similar manner is the IBM Transaction Processing Facility.

It can therefore be seen that it is currently a problem in CKD DASD subsystems to provide increased data availability while maintaining the higher performance levels of cached read and write operations in DASD systems not having such severe distance limitations and wherein the failure of a DASD system component will not make the stored data unavailable to the host.

SUMMARY OF THE INVENTION

The above problems are solved and an advance in the art is achieved by the present invention which comprises a DASD subsystem in which improved data availability is provided by a system in which the failure of a single system component will not prevent a connected host from obtaining access to stored data records and wherein the distance limitations of conventional DASD systems are significantly expanded. The DASD subsystem of the invention comprises a plurality of disk or data storage control units (hereinafter DSC) and one or more recording means, such as disk drives, connected via a disk controller to each DSC. The system operates in a conventional manner for a write request in which only a single record copy is desired. In this case, the DSC receives the write request from the host and causes one of the disk drives to which the DSC is connected via a disk controller to write the data record. In accordance with the invention, the system creates multiple copies of a record for a write request received for a volume (disk drive) for which the host has priorly specified that multiple copy service is to be provided for all subsequent write requests to the specified volume. For this multiple copy service, which is hereinafter referred to as extended dual copy service (when only two copies are to be provided), the host processor transmits write requests over a channel to a first DSC which is connected to a group of disk drives and which is further connected via a direct data link with a second DSC which is also connected to its own group of disk drives. The details of the manner in which the request is processed by the first DSC depends upon the type of service to be provided. The type of service that can be provided by the system of the invention includes single copy, regular dual copy as shown by Crockett, regular fast dual copy, extended dual copy, and extended fast dual copy. For the extended dual copy service, the first DSC enters the received information from the host into its cache and then transmits the information over the direct data link to the cache of the other DSC. The information in the cache of each DSC is then written to the disk drive of each DSC. The host is notified as to the completion of the execution of the write command only when the record has actually been written into a disk drive of each DSC. For the extended fast dual copy service of the present invention, the received information is entered into the cache memory of the first DSC and transmitted over the data link to the cache memory of the other DSC. The host is then advised that the execution of this write command has been completed. The two DSCs then subsequently operate on their own to cause the record data in each cache to be written to the disk drive to which each DSC is connected.

The arrangement of the invention is an improvement over the dual copy feature of Crockett et al. in that the failure of a single system element such as a disk controller common to all disk drives of the applicants first DSC will not prevent the host from accessing the duplicate copy of the record on a disk drive of the second DSC. In this case, the host can transmit a read request to the first DSC which passes the request via the direct data link to the second DSC whose disk drive executes the request, reads the duplicate copy of the record, and transmits the record contents over the data link to the first DSC and, in turn, to the requesting host.

A second possible exemplary embodiment of the invention provides a still higher degree of data availability. It is similar to that above-described except that the host is connected over separate data channels to both the first and the second DSC. Normally the host operates as above-described by transmitting read and write requests to the first DSC which executes the requests on its own connected disk drives. The first DSC is also connected in this alternative arrangement over the direct data link to the second DSC and, on each write operation that requests extended dual copy service to a specified volume, it communicates with the second DSC over the direct data link to cause the second DSC and its connected disk drives to make a duplicate copy of the data record. This second embodiment provides still greater data availability in that the duplicate data record remains available to the host even if the first DSC becomes unavailable. In this case, the host detects the inoperable condition of the first DSC and communicates with the second DSC via a data channel extending from the host to the second DSC. The host can then read and write the duplicate copies of the data records stored on the disk drives connected to the second DSC.

A still higher degree of data availability is provided by yet another alternative exemplary embodiment of the invention. In accordance with this embodiment, a pair of host processors are connected over separate data channels to both a first and a second DSC which are directly connected with each other via a direct data link. Each DSC is connected to its own individual group of disk drives. The host processors can operate independently and each normally communicates with a different one of the DSCs. In other words, each DSC is a primary DSC to a different one of the hosts. On each write command from a host specifying extended dual copy service, the primary DSC causes the data record to be written onto one of its disk drives. The primary DSC also causes a duplicate copy of the data record to be written onto the disk units of the other DSC via the direct data link between the two DSCs. In accordance with this arrangement, the failure of a single DSC and/or its associated disk units permits a copy of each record to be available to the host via the other DSC and its disk units. Further in accordance with this alternative arrangement, the system remains operable even if one of the host processors and one of the DSCs and its associated disk units fail concurrently. In this case, the remaining host processor can take over the duties of the failed host. The data records that were written under control of the failed host remain available to the second host as long as one of the DSCs and its connected disk units remains available and operable.

In accordance with a further possible alternative exemplary embodiment of the invention, each DSC is connected by two separate direct data links and associated circuitry with the other DSC. This duplication provides increased data availability since if the one of the direct data links becomes unavailable, the direct communication between the two DSCs may still take place via the other direct data link and its connected circuitry.

In accordance with another possible exemplary alternative embodiment of the invention, a number of additional DSCs interconnected by additional direct data links may be employed to provide a number of multiple copies greater than two. Thus, a system having, for example, four DSCs, four sets of disk drives and four direct data links interconnecting the four DSCs could be used to provide "extended multiple copy service" to generate up to four copies of each record written to a specified volume of each DSC.

In view of the above, it can be seen that the above embodiments of the invention provide the high degree of data availability that many businesses require for circumstances in which all possible steps must be taken to ensure the availability of recorded data under the most extreme and unlikely occurring events that may transpire.

DESCRIPTION OF THE DRAWINGS

These and other advantages and features of the invention may be better understood from a reading of the following description thereof taken in conjunction with the drawing in which:

FIGS. 15-17 disclose further details of the command sequence of FIG. 14;

FIGS. 18-22 disclose the messages transmitted over data links 106 for the provision of extended multiple copy and connectivity service.

DETAILED DESCRIPTION

Figure 1:
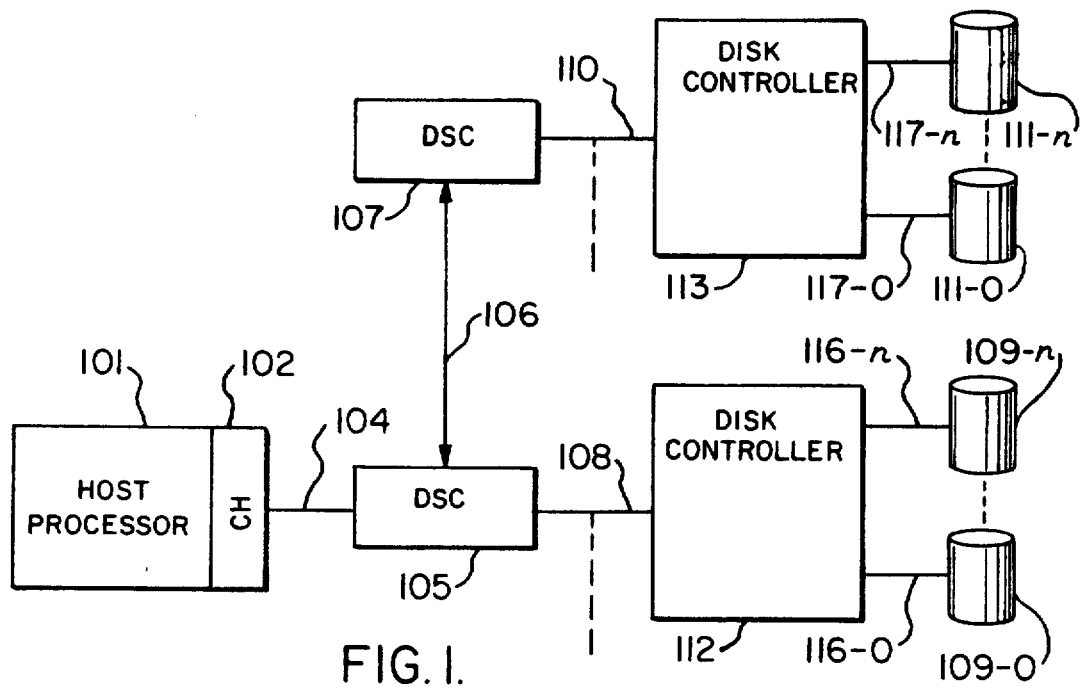
FIG. 1 comprises a block diagram illustrating one possible exemplary embodiment of the invention.

Description of FIG. 1

FIG. 1 discloses one possible exemplary embodiment of a system embodying the invention. FIG. 1 discloses a host processor 101 connected via a channel 102 and a channel interface 104 to DSC 105 which is connected over interface 108 to disk controller 112 and its disk drives 109-0 through 109-n via paths 116-0 through 116-9. The system of FIG. 1 further comprises a data link 106 which interconnects DSC 105 with a second DSC 107 which may be identical to DSC 105. Data link 106 ideally may be optical fiber but, if desired, may be any type of transmission path such as metallic conductors. DSC 107 is connected via interface 110 to its own disk controller 113 and via paths 117-0 through 117-9 to disk drives 111-0 through 111-n.

Host 101 communicates in a conventional manner with DSC 105 via interface 104 to transmit record write and read requests to DSC 105. DSC 105 receives these requests and communicates over interface 108 with disk controller 112 and disk drives 109 to execute the write and read requests. The system of FIG. 1 processes write requests that do not involve extended dual copy service in a conventional manner similar to that of known DASD systems. Namely, DSC 105 receives the request from host 101, processes the request and causes the record to be written on one of disk drives 109. The system of FIG. 1 can provide regular dual copy service similar to Crockett by causing a record to be written to two of its disk drives 109.

On each write request for volumes for which the extended duplicate copy of the invention is desired by host 101, DSC 105 transmits the received write request over data link 106 to DSC 107 which causes an extended duplicate copy of the record to be written by the appropriate one of its disk drives 111. In this manner and for volumes specified by host 101, a copy of each record written on one of disk drives 109 is also written on one of disk drives 111. The system of FIG. 1 provides increased data availability over that which would be available if disk drives 111, DSC 107 and data link 106 were not provided. Increased data availability is provided in that upon an operational failure of disk controller 112, which would make all records on disk drives 109 unavailable, host 101, DSC 105 and DSC 107, can exchange the commands required to read the extended duplicate copy of the record that exists on disk drives 111. The readout information is transmitted from disk drives 111, over interface 110, DSC 107, data link 106, DSC 105 and interface 104 back to host 101.

Figure 2:
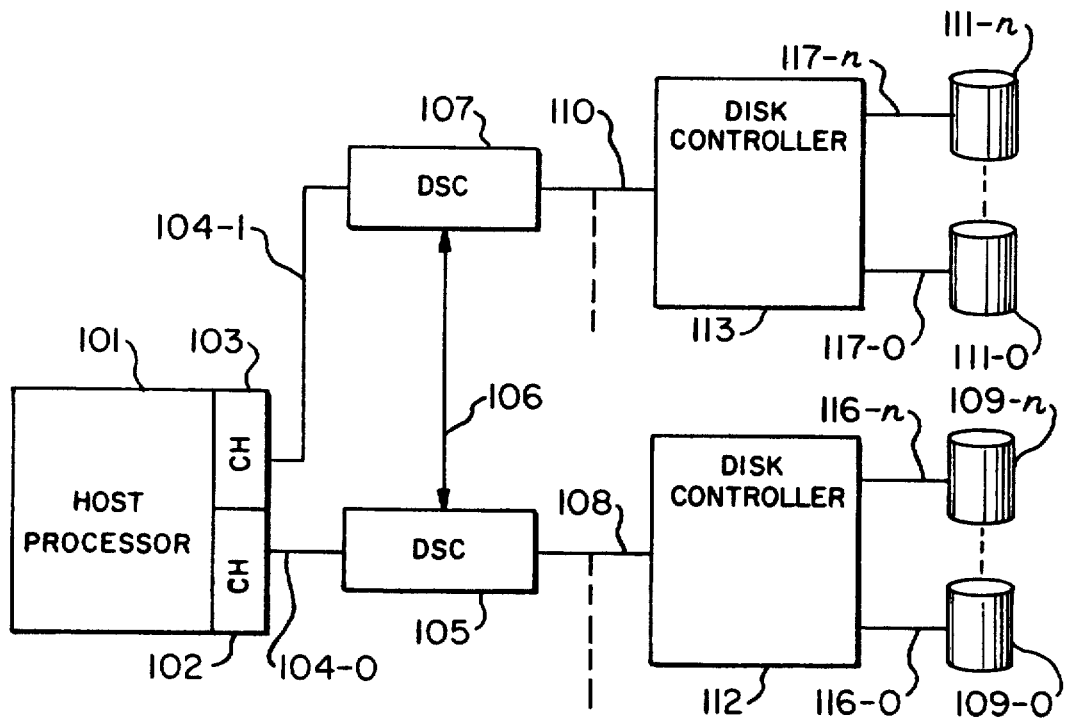
FIG. 2 illustrates an alternative exemplary embodiment of the invention that provides increased data availability over the embodiment of FIG. 1.

Description of FIG. 2

FIG. 2 discloses a system similar to FIG. 1 but which has improved data availability. Host 101 is additionally connected via channel 103 and interface 104-1 to DSC 107. Host 101 normally communicates with DSC 105 and causes data records to be written onto disk drives 109. On each write operation to volumes specified by the host for extended dual copy service, DSC 105 transmits each write command over data link 106 to DSC 107 to cause an extended duplicate copy of the record to be recorded onto a disk drive 111. The system of FIG. 2 provides increased availability since upon a failure of DSC 105, host 101 can communicate with DSC 107 via channel 103 and interface 104-1 to read the copies of the data records that exist on disk drives 111. Host 101 may continue to operate in a normal manner and communicate with DSC 107 and its drives 111 until DSC 105 is repaired and brought back on line.

Figure 3:
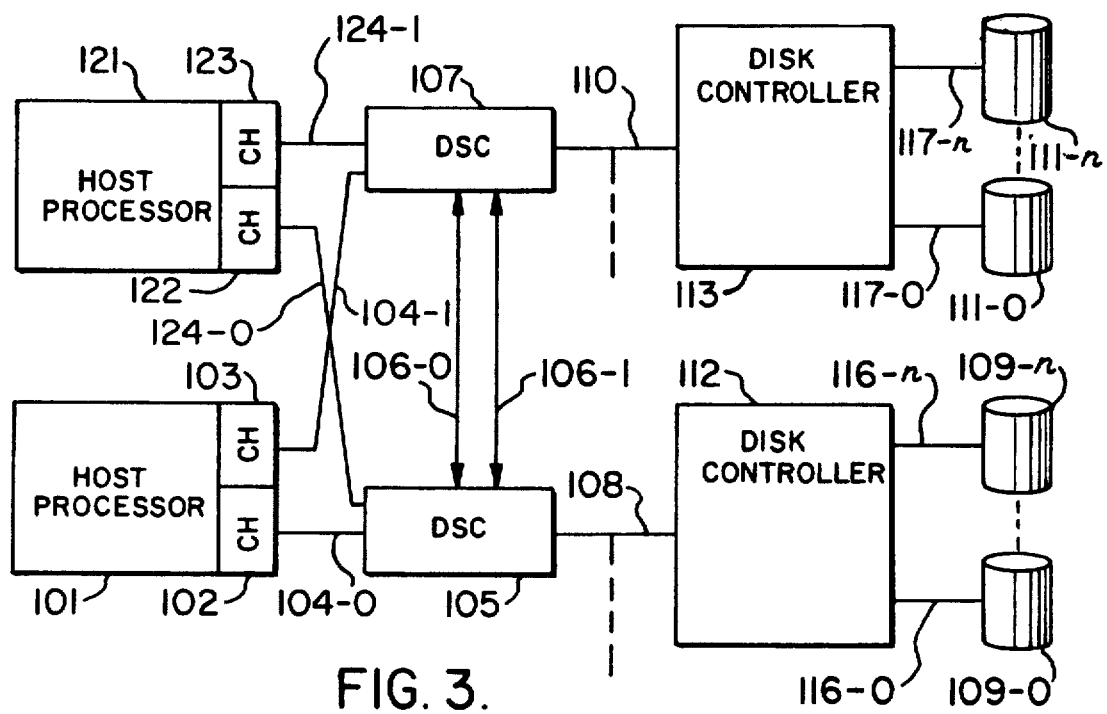
FIG. 3 illustrates yet another possible exemplary embodiment of the invention and which provides still greater, data availability.

Description of FIG. 3

FIG. 3 discloses yet another alternative exemplary embodiment of the invention which provides greater data availability over that shown on FIGS. 1 and 2. In the system of FIG. 3, an additional host processor 121 is provided which is connected via channel 122 and interface 124-0 with DSC 105 and is further connected by channel 123 and interface 124-1 with DSC 107. Both hosts 101 and 121 may operate concurrently and independently with each normally communicating only with its primary DSC and connected disk drives. Thus, host 101 may normally communicate primarily with DSC 105 and its disk drives 109 and host 121 may normally communicate primarily with DSC 107 and its disk drives 111. However, on each write operation by either host for volumes specified for extended dual copy service, the data record is written not only on the disk drives of the DSC with which the host normally communicates, but by means of data links 106, the other DSC causes an extended duplicate copy of each such record to be recorded on its disk drives. Let it be assumed that host 101 normally communicates primarily with DSC 105. On each write operation for a specified volume for which an extended duplicate copy of the record is desired, DSC 105 transmits a command over data link 106 to DSC 107 to cause a duplicate copy of the record to be recorded on disk drives 111. In a similar manner, assume host 121 normally communicates only with DSC 107 and its disk drives 111. However, on each write operation for volumes for which extended dual copy service is desired, data links 106 and DSC 105 cause an extended duplicate copy of the data records to be recorded on disk drives 109.

Upon a failure of disk drives 109 and/or disk controller 112, and/or DSC 105, host 101 may continue normal operation by communicating with DSC 107 over interface 104-1 to operate with the extended duplicate records on disk drives 111. Host 121 may continue normal operation in a similar manner upon the failure of disk drives 111 and/or disk controller 113 and/or DSC 107 and operate with the extended duplicate copies of the data records that exist on disk drives 109. The system of FIG. 3 provides still further system availability in that upon a failure of a host, such as host 101, host 121 may perform duties of the failed host by operating upon either the original or the extended duplicate copy of the records that exist on disk drives 109 and 111.

Figure 4:
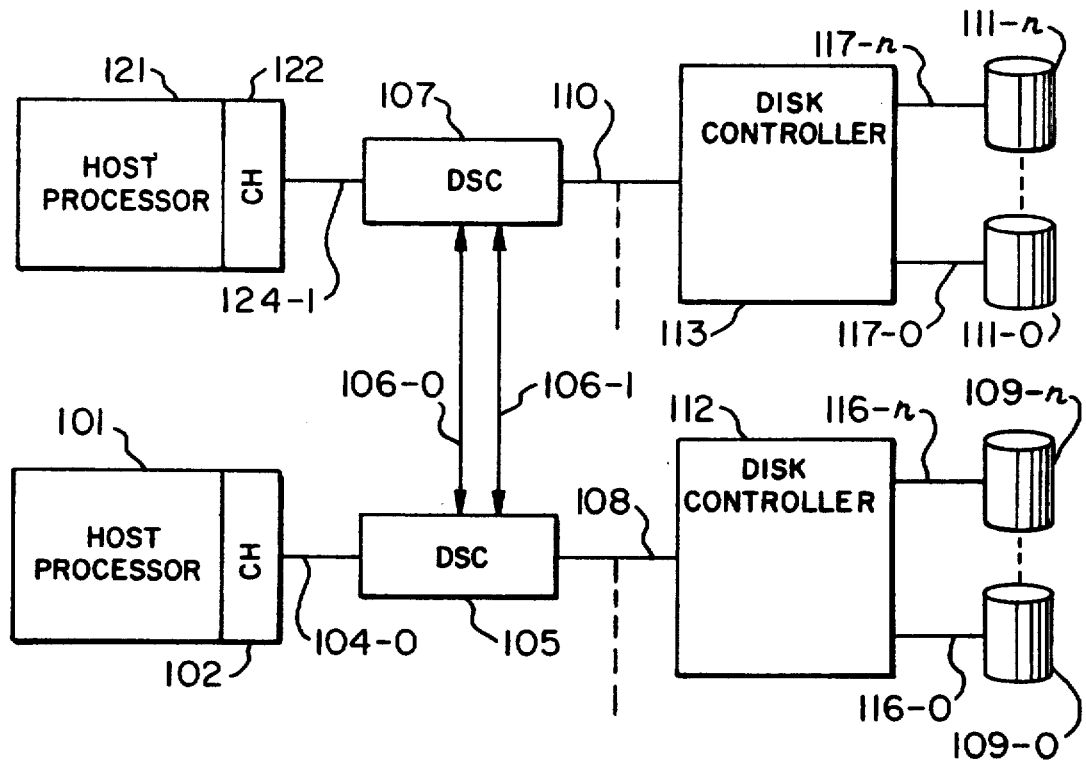
FIG. 4 illustrates another alternative exemplary embodiment that is independent of host channel distance limitations.

Description of FIG. 4

FIG. 4 discloses an embodiment of the invention that is a degenerate version of the system shown in FIG. 3. The system of FIG. 4 is similar to that of FIG. 3 except that each host is connected to only a single DSC. The system of FIG. 4 is advantageous in systems in which the hosts are separated from one another by a distance greater than 480 meters, which is twice the priorly discussed 240 meter limit applicable to conventional CKD DASD systems. In the system of FIG. 4 the hosts may be separated from each other by a considerably greater distance, for example 5 km. The two DSCs may be separated from one another by this same distance. However, the distance between a host, such as host 101, and its disk drives 109 must still meet the aforementioned 300 meter limit.

The system of FIG. 4 is not limited to the provision of extended dual copy service. It can also be used in installations in which DSCs 105 and 107 are separated by a considerable distance, such as 5 km, and where it is desired to have host processors 101 and 121 share a common set of disk drives, such as for example, disk drive 109, for the storage of some of the data records generated by both host processors. For example, let it be assumed that host processor 101, DSC 105, disk controller 112 and disk drives 109 are in a first work location which is separated from a second work location containing host processor 121, DSC 107, disk controller 113 and disk drives 111. Let it be further assumed that for some of their work assignments, the users at host processor 101 work independently and create data records that are recorded on disk drives 109. Let it further be assumed that the users of host processor 121 also have certain independent work assignments and record the data records pertaining to these assignments on disk drives 111. However, let it also be assumed that the users of host processors 101 and 121 have certain common work assignments for which it is desired to have users of both host processors write the data records pertaining to these joint assignments on disk drives 109.

For these joint assignments, the users of host processor 101 work in the conventional manner so that their data records are recorded on disk drives 109. For these joint work assignments, users of host processor 121 generate records which are transmitted over path 124-1 to DSC 107 which causes these records and associated control commands to be transmitted over direct data links 106 to DSC 105. DSC 105 responds to the reception of these commands and records and causes the records to be transmitted over path 108 and via disk controller 112 for writing on a selected one of disk drives 109. In this manner, certain data records written by the users of both host processors 101 and 121 are written on disk drives 109. This permits the users of both host processors to share the data records stored on disk drives 109 that pertain to the work activities common to both groups of users.

This writing on disk drives 109 of data records generated by host processor 121 may be accomplished either with or without the use of extended dual copy service. If there is no need to have these records also recorded on a disk drive 111, the system may operate as just described so that the data records generated by host processor 121 are transmitted via DSC 107 to DSC 105 for writing on a disk drive 109. On the other hand, the writing of the records generated by host 121 and pertaining to joint work responsibilities may be accomplished using extended dual copy service wherein a first copy of the data record is written on disk drive 111 operating as a local volume and by having the second copy of the data record written on a disk drive 109 operating on a remote volume basis.

The above-described joint sharing of data records by users at two different host processors is advantageous in situations in which the DSC and disk controller and disk drives associated with a first host processor are situated at a distance sufficiently remote from these corresponding elements and a second host processor so that the aforementioned DASD operational distance limitations are exceeded. In this case, the system of the present invention permits useful system operation with a distance of up to approximately five kilometers for data links 106.

It may be seen in view of the above that the systems shown on FIGS. 1, 2, 3 and 4 provide greatly improved data availability for users who must take all practicable steps to ensure a high degree of data integrity and data availability under all possible adverse operating conditions.

Figure 5:
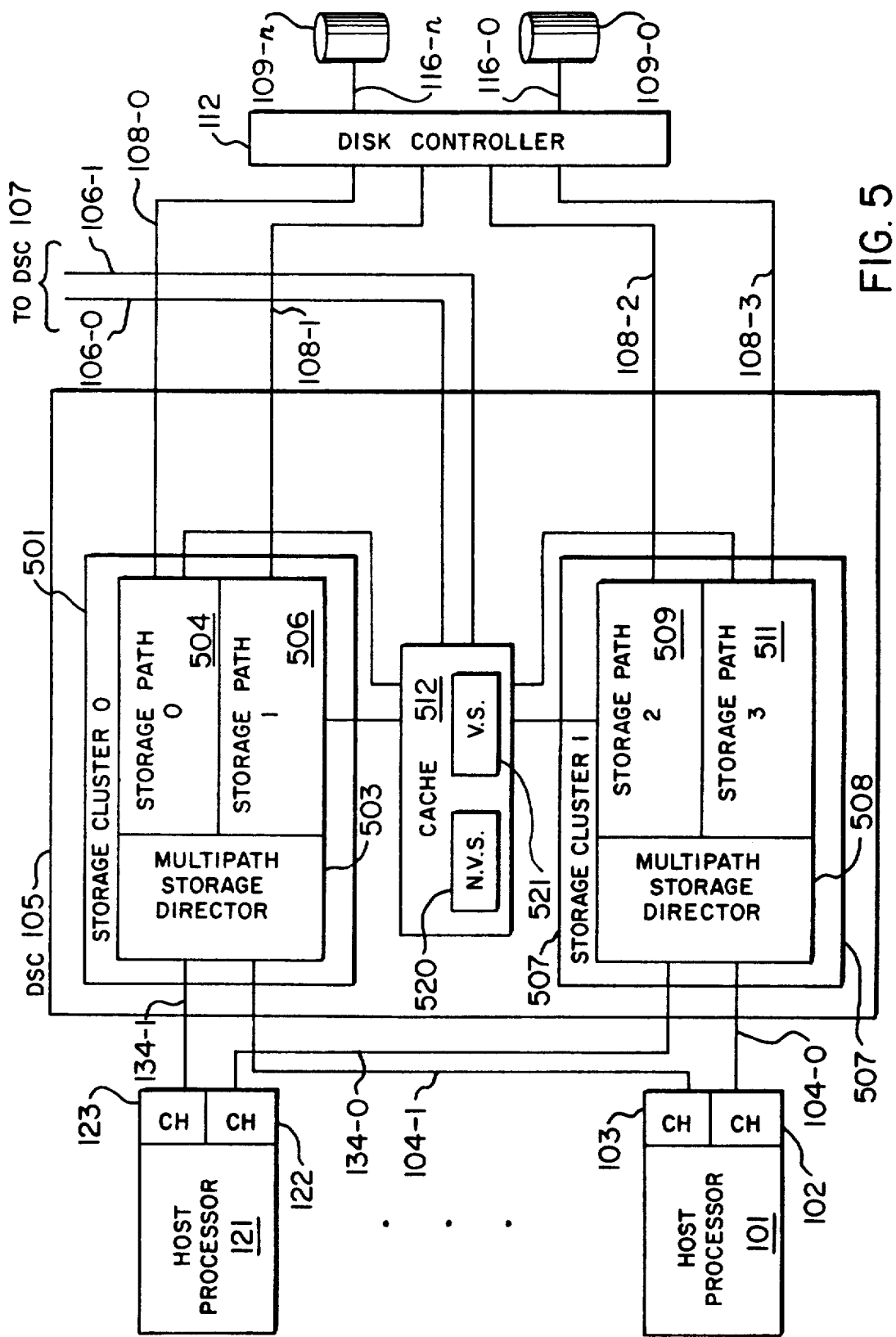
FIG. 5 illustrates further details of a disk storage control (DSC)

Description of FIG. 5

FIG. 5 shows further details of the system of FIG. 3. Specifically, FIG. 5 shows a plurality of host processors 101 through 121, connected to DSC 105. DSC 105 is connected via disk controller 112 to disk drives 109-0 through 109-n. DSC 105 is connected to data links 106-0 and 106-1 which extend to DSC 107. DSC 105 comprises storage clusters 501 and 507 each of which comprises a pair of storage paths and a multi-path storage director. Storage cluster 501 comprises storage paths 504 and 506 and multi-path storage director 503. Storage cluster 507 comprises comparable elements 508, 509 and 511. Host 121 is connected over path 134-1 to multi-path storage director 503 of cluster 501 and over path 134-0 to multi-path storage director 508 of cluster 507. Host 101 is connected over path 104-1 to storage director 503 and is connected over path 104-0 to storage director 508.

In a manner well-known in DASD subsystems, DSC 105 contains cache memory 512 having a volatile store portion (VS) 521 and a non-volatile store portion (NVS) 520. Conductors 108-0 and 108-1 interconnect storage paths 504 and 506 of storage cluster 501 with disk controller 112. Conductors 108-2 and 108-3 connect disk controller 112 with storage paths 509 and 511 of cluster 507.

The function of DASD sub-systems containing DSCs and disk drives is well-known in the art and is shown in the IBM publication GA32-0098-0, "Storage Subsystem Library IBM 3990 Storage Control Introduction", first edition, published in 1987 by the International Business Machines Corporation and available at any IBM local branch office. The DSC and disk drives of the present invention perform many functions in a manner similar to that of the IBM 3990 Storage Control and its disk drives. Therefore, the functions of the DSC 105 of the present invention that are similar to those of the IBM 3990 system are only briefly mentioned herein. The functions of DSC 105 of the present invention that are not comparable to those of the IBM 3990 system are described in detail.

The system of FIG. 5 operates in a manner similar to the IBM 3990 system for host read and write requests that are received by DSC 105 for execution by disk drives 109 to which DSC 105 is connected via paths 108. The two storage paths within each cluster provide separate facilities that may be used concurrently to provide separate communication paths between the host processors and the disk drives 109. Each storage path within a cluster may independently process a host read and write request. As in the IBM 3990 system, volatile store (VS) 521 and non-volatile store (NVS) 520 are used on write requests requiring the services of cache memory 512. Read requests normally require the service of only VS 521.

By way of distinction from the IBM 3990 subsystem, the system of FIG. 5 additionally contains data links 106-0 and 106-1 which extend to DSC 107 which may be separated a considerable distance, such as five thousand meters, from DSC 105. As is subsequently described in detail, this permits the system of FIG. 5 to operate with DSC 107 and its disk drives 111 to write extended duplicate copies of records recorded on specified disk drives 109.

The IBM 3990 system provides user controllable duplicate copy service of the type shown by Crockett that is limited to a single DSC and its disk drives. In other words, when requested by a host processor, the IBM 3990 system can cause duplicate record copies to be written by two different disk drives connected to a single DSC. In the IBM 3990 system, a user generates a host system command which instructs its DSC that all write requests to certain user specified volumes are to be executed by causing duplicate copies of each record to be written to the specified volumes. The duplicate copies are written by two different disk drives connected via one or more disk controllers to a single DSC. While the conventional IBM 3990 dual copy arrangement provides improved data availability over a single copy mode of operation, it is subject to failure if the single DSC or disk controller 112 serving the disk drives 109 containing the two copies should fail.

In the system of FIG. 5 and in accordance with the invention, the user generates a host command sequence that is transmitted to DSC 105 instructing it that on all subsequent write requests to a user specified volume, extended duplicate copies of the records are to be written with one copy being written by a disk drive 109 and with the other copy being written by a disk drive 111 of DSC 107 on FIG. 3.

Let it be assumed that DSC 105 receives a write request for a volume that a user has priorly specified is to be operated with extended dual copy service. This received write request is initially processed by the storage cluster 501 or 507 that receives the write request and, in a manner similar to the IBM 3990 system, the request is transmitted via conductors 108 to disk controller 112 which ultimately causes the write request to be written by the disk drive 109 comprising the user specified volume. The storage cluster receiving this request also communicates with cache 512 and causes the write request to be stored in cache 512. Cache 512 and the storage cluster operate cooperatively to extend the request over one of data links 106-0 or 106-1 to DSC 107. The request is received and stored in the cache memory of DSC 107. The cache memory of DSC 107 and one of its storage clusters process the received request and cause a copy of the record to be written on one of the disk drives 111.

DSC 105 can also operate to write an extended dual copy of a record on one of its disk drives 109 when the first copy of the record is written on a disk drive 111 of DSC 107. In this case, DSC 107 receives a write request for a specified volume for which extended dual copy service has been priorly requested and causes the first copy of the record to be written on one of disk drives 111. The cache memory within DSC 107 transmits the request over one of data links 106 to cache memory 512 of DSC 105 of FIG. 5. Following this, cache memory 512 and one of storage clusters 501 or 507 operate to cause an extended dual copy of the record to be made by one of disk drives 109.

DSC 105 is comparable to the storage control shown in the aforementioned IBM 3990 publication in that it serves a plurality of host processors, that it contains a pair of storage clusters each of which contains a single multi-path storage director and a pair of storage paths. Except for the extended dual copy operations, the other system functions of the system of FIG. 4 need not be further described since they are similar to those of the IBM 3990 system.

Figure 6:
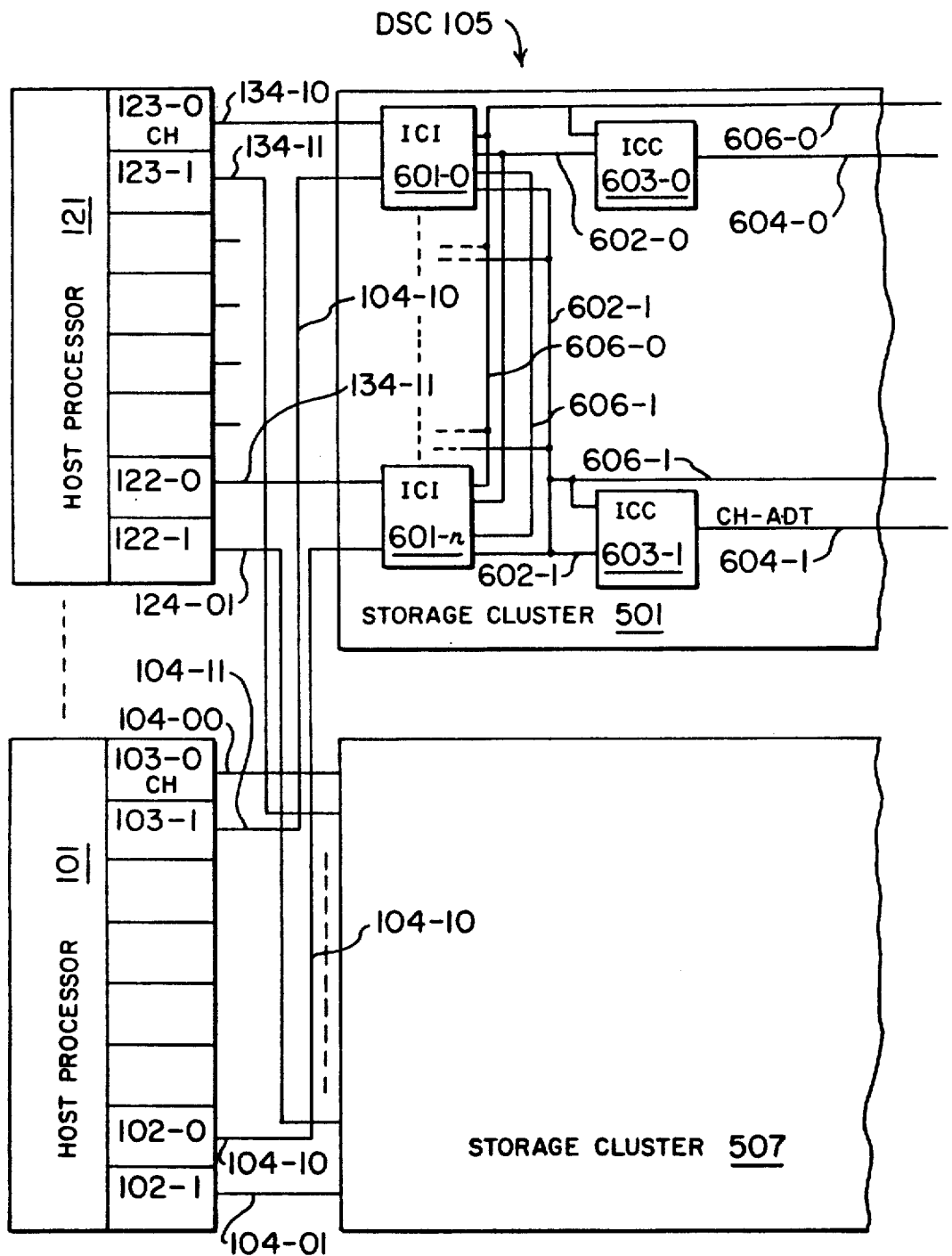
FIGS. 6, 7 and 8, when arranged as shown in FIG. 9, illustrate further details of the system of FIG. 5.
Figure 7:
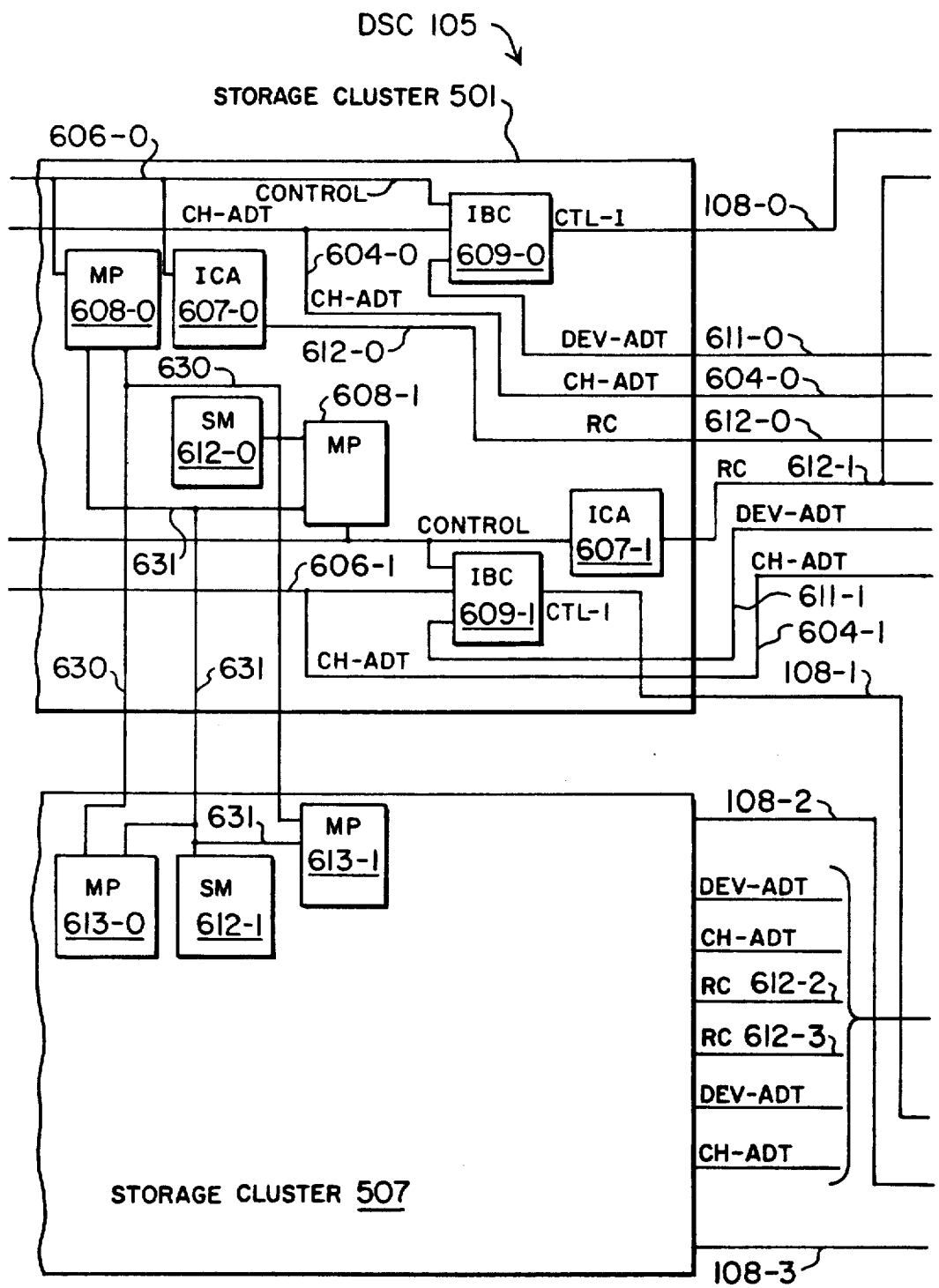
Figure 8:
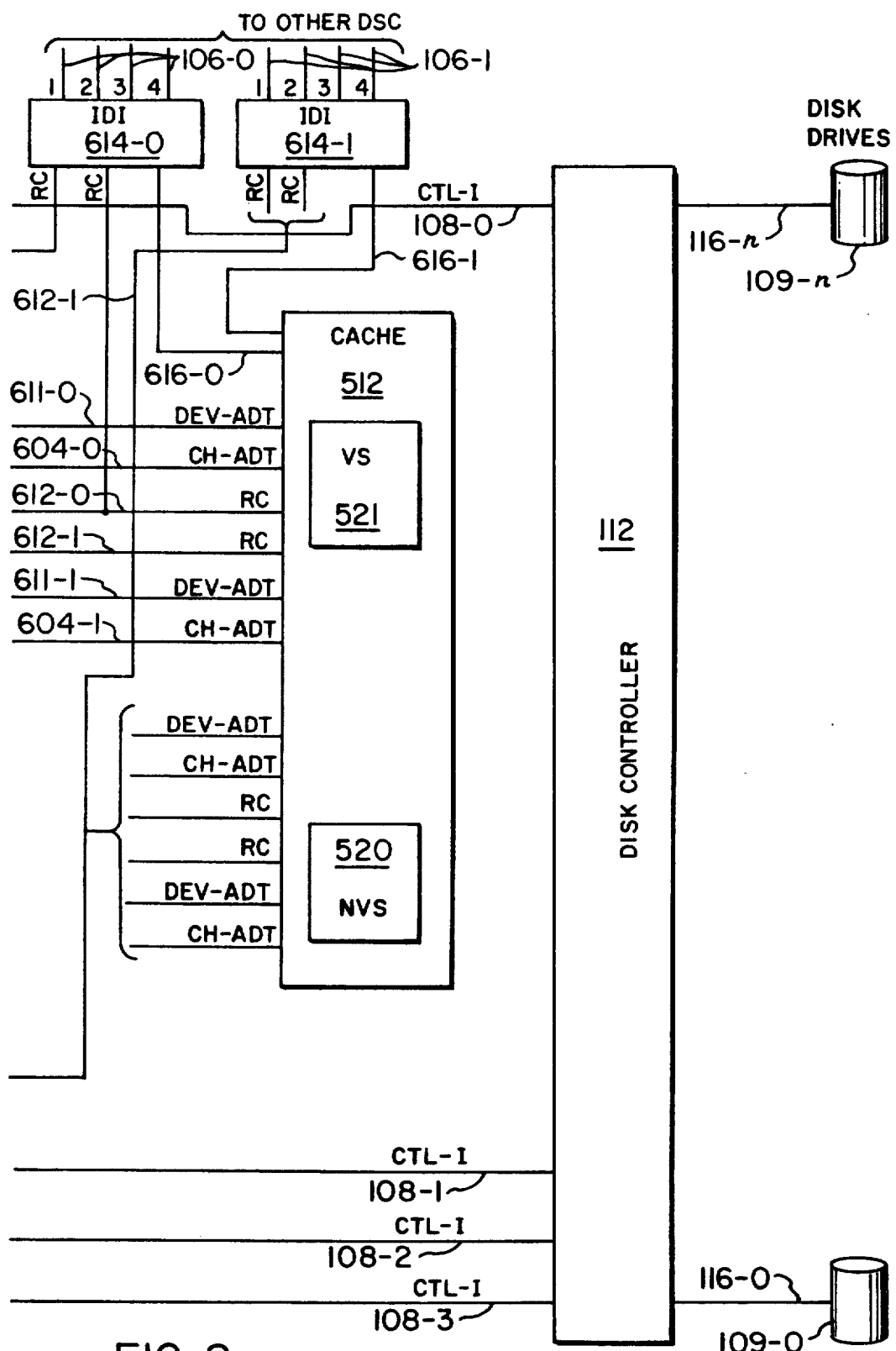

Description of FIGS. 6 through 8

Figure 9:
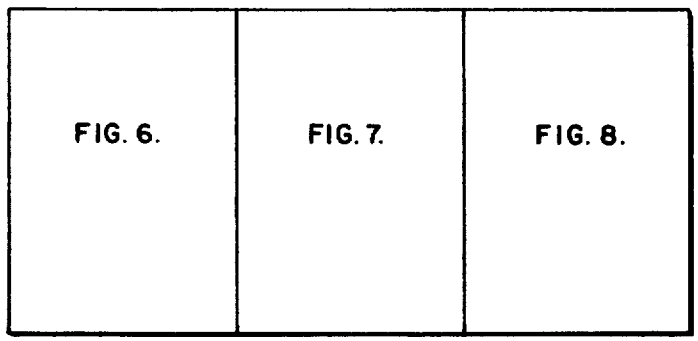

FIGS. 6 through 8, when arranged as shown on FIG. 9, disclose further details of the system of FIG. 5. The left side of DSC 105 on FIG. 6 connects to a plurality of host processors 101 through 121 and on its right side on FIG. 8 connects to a plurality of disk drives 109 via disk controller 112. As on FIG. 5, DSC 105 comprises a pair of storage clusters 501 and 507. The elements comprising storage cluster 501 are shown in detail; the elements comprising storage cluster 507 are shown only diagrammatically since they are identical to those of storage cluster 501.

The host processors are connected via channels and paths to ICI elements 601 within each storage cluster. Each host processor is connected to two different ICI elements in each cluster. Thus, host processor 121 is connected via channel 123-0 and path 134-10 to ICI element 601-0. Host processor 121 is also connected via channel 122-0 and path 134-11 to ICI element 601-n of cluster 401. Host processor 121 is further connected via channels 123-1 and 122-1 and over paths 134-00 and 134-01 to ICI elements (not shown) within storage cluster 507. These connections permit each host processor to have a plurality of connections to each storage cluster so as to provide a non-blocking configuration in which a requesting host will normally have an available connection to each storage cluster.

As is the case in the IBM 3990 system, each storage cluster provides a pair of storage paths extending to disk controller 112 and disk units 109. These duplicated paths permit each storage cluster to serve a pair of host read or write requests concurrently. The ICI elements comprise an interface which operates under control of microprocessors 608 and 613 to interconnect one of the two left-side channel ports of an ICI element with one of its two right side ports to control busses 606-0 and 606-1. A read or write request received by an ICI element, such as 601-0 of cluster 501 on path 134-10, may be extended to ICC element 603-0 via path 602-0 of the upper portion of the storage cluster or may be extended over path 602-1 to ICC element 603-1 of the lower portion of storage cluster 501. The ICI elements are connected over either control bus 606-0 to microprocessor 608-0 and is further connected via control bus 606-1 to microprocessor 608-1.

Each ICI interface element 601, in conjunction with microprocessors 508 or 613, facilitates communication of DSC 105 with a host channel, such as 123, to accept selection, transfer of channel commands to DSC 105, transfer of status from DSC 105 to a channel and transfer of data in either direction as is well-known in DASD systems. DSC 105 also sends commands to disk controller 112 to concurrently move DASD actuator mechanisms (seek), initialize each of the DASDs to compare a required sector against the actual sector currently under the DASD actuator (set SECTOR), read any of the count, key or data fields (where such architecture is implemented) or other fixed-length fields, where fixed block architecture is implemented. DSC 105 also includes capabilities to compare the contents of a field read from a disk unit 109 against data received from a channel and to respond with low, equal, or high status. Data transfer is accomplished by first moving a DASD actuator to the desired track and then waiting for a pre-defined sector to occur under the head. The data transfer path is normally disconnected while these operations go on and reconnected at their conclusion while being free to effect other operations. Following this, a count field is read from the disk unit. Data from this count field is then compared with the data from a channel and when the comparison is satisfied, the following field may be written on the record. If the operation is a READ (as dictated by a read command from a channel), data is read from the appropriate disk drive and is eventually presented on a channel. If the operation is a write, data is received from the channel, stored in DSC 105 and then presented to the appropriate disk drive 109 via the disk controller 112.

Busses 602-0 and 602-1 on the right side of ICI elements 601 are connected to the left side of ICC elements 603-0 and 603-1. The ICC elements are primarily responsible for implementing the DASD data streaming function and protocol. This function is well-known and is described in IBM publication GA22-6974-09, File No. S360/S370-19 entitled "IBM System/360 & System/370 I/O Interface Channel to Control Unit Original Equipment Manufacturers' Information." This ICC element monitors the data flow to and from the channels and the adherence of the data flow to required protocols. As long as the data flow meets the protocol requirements, the ICC element is essentially invisible to the data flow insofar as the present invention is concerned. The ICC element is functionally operative only in the event that the data flow fails to meet the protocol. In this case the ICC element advises microprocessors 608 and 613 of this condition so that the microprocessors can take the required remedial action.

A read or write request received by a particular ICI element, such as ICI element 601-0 is extended over path 602-0 and through ICC element 603-0 to the CH-ADT bus 604-0. This bus extends to IBC element 609-0 as well as to cache memory 512. The IBC element 609-0 is subsequently described in detail and it comprises a bi-directional switching element which can connect either of its two left-side ports with its right-side port. The right-side port connects to CTL-I path 108-0 which extends to disk controller 112. On its left side, the IBC element is connected on its upper port via the CH-ADT path 604-0 to ICC element 603-0. The IBC element 609-0 is connected by its lower left port to the DEV-ADT path 611-0 extending to cache memory 512.

The IDI elements 614-0 and 614-1 are subsequently described in detail and comprise intelligent electrical to optical interfaces that permit cache memory 512 to transmit data over paths 616 and optical data links 106 to DSC 107 on operations in which extended dual copy service is required. The IDI elements 614 are connected to remote control busses (RC) 612.

The ICA elements 607 are bi-directional and connect to control busses 606 to convert the timing and control pulses on control busses 606 to the timing and control pulses required to operate cache memory 512 and IDI elements 614. These converted pulses are applied by each ICA element 607 over its associated RC path 612 to cache memory 512 and IDI elements 614. The SM elements 612 and 613 are memories that are shared jointly between the microprocessors 608-0 and 608-1 and microprocessors 613-0 and 613-1 in cluster 507. These interconnections permit memories 612 and 613 to share memory information with both the upper and lower portions of storage cluster 501 and cluster 507.

The lower portion of storage cluster 501 comprises an ICC element 603-1, an IBC element 609-1, and an ICA element 607-1 with each such element being identical in function to that already described for the correspondingly designated elements on the upper portion of storage cluster 501. Similarly, storage cluster 507, which is shown only diagrammatically, contains elements identical to those shown in detail for storage cluster 501. The connections extending from storage cluster 507 to cache memory 512 permit cache memory 512 to serve the elements of storage cluster 507 as well as those of storage cluster 501.

The elements shown in detail on FIGS. 6 through 8 to permit DSC 105 to perform many read and write DASD functions in a manner comparable to the IBM Model 3990 storage control unit. Thus, the system of FIGS. 6 through 8 can perform DASD fast write operations which improve the storage subsystem performance because immediate access to the disk units 109 is not required for write hits and for full-track format writes. A DASD fast write operation stores the received data simultaneously in the VS portion 521 of cache 512 as well as in NVS cache portion 520. Access to disk drives 109 is not required to complete a DASD fast write operation for write hits. Because a copy of the record data is written to NVS 520, DSC 105 returns channel end and device end status signals to the host at the end of the data transfer to VS 521 and NVS 520. This allows the host program to continue processing without waiting for the data to be written to disk drives 109. The data remains in VS 521 and in the NVS 520 until the data is subsequently written to disk drives 109 to free space in the VS or the NVS. Most write operations write directly to the cache memory 512 without going to the disk drives 109. This results in the same operational performance as does a read hit operation.

On DASD fast-write operations, the information is received from a host, such as host 121 over path 134-10, and is extended through ICI element 601-0 and ICC element 603-0. From there, it is extended over CH-ADT path 604-0 directly to cache memory 512. The cache memory 512 writes the information into VS 521 and NVS 520. Subsequently, when the information is to be written to a disk drive 109, the information is read out of the cache on path 611-0, extended through IBC element 609-0, and applied over CTL-I path 108-0 to disk controller 112 which causes the information to be written to one of the disk drives 109. If the system is unable to write data from the cache memory, the copy in NVS portion 520 of the cache is used to destage the data. DASD fast write operations allow fast write hits and preserve data integrity and availability by maintaining two copies of all data modifications. One copy is in VS 521 while the other is in NVS 520.

The system of FIGS. 6 through 8 permits data to be transferred between a channel and cache 512, between a channel and a disk drive 109 and between a disk drive 109 and the cache. Data can be transferred from a disk drive 109 to a channel at the same time the data is written to the cache. Data transferred from a channel to a disk drive 109 may also be transferred to the cache. Data can also be transferred between the cache and a channel and between the cache and a disk drive 109 at the same time. Data transfers to the cache can also go to the NVS 520 at the same time. Data transfers are made from the NVS 520 to disk drives 109 for error and data recovery conditions only.

If a copy of a data record is in cache memory 512 when the channel initiates a basic write caching write request (write hit), DSC 105 writes the data directly to a disk drive 109 at the same time writes the data into the cache memory. The record in the cache is updated because it may be referred to again. However, before DSC 105 can signal the operation as complete to the channel, it must ensure that the record has been successfully written to the disk drive. The record is simultaneously written to the cache and to the disk drive with the device-end signal returned at completion. This is an example of branching data transfers. Writing to the disk drive provides data integrity because copies in the cache memory and the disk drive are identical. When a record being updated is not found in the cache memory, the condition is termed a write miss and the record is written directly to the disk drive and not written to the cache memory.

The system of FIGS. 6 through 8 also processes read requests in which the requested record is not in the cache (read misses) as well as read requests for which the requested record is in the cache (read hits). If a copy of the data is in the cache when the host processor initiates a read request, DSC 105 transfers the desired data from the cache to the host via CH-ADT path 604-0 and the channel. If a copy of the data is not in the cache, DSC 105 sends the requested data directly to the channel from the disk drive and at the same time writes the data (plus the rest of the data from that record to the end of the track) into the cache memory in anticipation of future use. Subsequent requests for following records on that track are then read from the cache memory and are read hits.

The extended dual copy feature of the present invention provides a number of important advantages over known DASD systems. It protects data record availability on a critical volume from a single device failure by causing the concurrent writing of the data records to separate devices of separate subsystems. Data transfer operations are switched to a secondary device on the other subsystem if a failure occurs of a primary device. The switching is transparent to the application program. It provides for near continuous operations by providing a back-up copy if access is lost to one of the dual copy devices. Lastly it ensures that a second copy is always available that is identical to the primary. The status of the extended dual copy operation is kept in the SM 612. Extended dual copy is activated or deactivated by a host system command sequence. Using the extended dual copy feature requires no modifications to access methods or applications.

The two disk drives involved on an extended dual copy operation are termed a duplex pair comprising a local device and a remote device. The extended dual copy operation is managed by the subsystem. All I/O operations are directed to the local volume. The system automatically updates both copies of the data. Data is accessed from the remote disk drive only if the local disk drive or DSC is not available. The duplex pair is established by host system commands. The remote drive is automatically synchronized with the local drive when both volumes remain available to the subsystem. Because the remote drive is offline, the processor knows of only one device—the local drive. The write operation to the remote device is transparent to the host. The DASD fast write capability can be applied to the extended dual copy capability to produce an extended fast dual copy capability. This results in an optimum of data availability, performance and reliability.

With regard to extended dual copy operations and the system of FIGS. 6 through 8, let it be assumed that a user has transmitted system commands to storage cluster 501 to prepare it for the establishment of extended dual copy service for a specified volume 109. These commands are received by microprocessor 608-0 of storage cluster 501 which, working with the shared memory 612, effects the system operation so that all subsequent write requests to this specified volume are processed on an extended dual copy basis. Subsequently, when a record write request is received for the specified volume, the record is written to the disk drive in each of DSCs 105 and 107 serving the specified volume. Let it be assumed that the record for the subsequent request is written to disk drive 109-n. At the same time, cache memory 512 and microprocessor 608 working together cause a copy of the record to be applied over one of paths 616 and one of IDI elements 614 for transmission over one of optical data links 106 to DSC 107. This received record is entered by DSC 107 into its cache memory. From there it is applied via its IBC element 609 to its disk controller 113 for writing on the disk drive 111 which has been designated as the remote unit of the duplex pair designated for extended dual copy service. A duplicate copy of the record is written on this particular disk drive 111 and following this operation, DSC 107 transmits an acknowledgment message back over one of the optical links 106 to DSC 105 advising it that the duplicate copy of the record has been recorded on a disk drive 111. Following the receipt of this acknowledgment on extended dual copy write operations, DSC 105 returns a signal to the channel that the extended dual copy write operation has been completed. For extended fast dual copy write operations, the completion signal is returned to the channel when the record is received and acknowledged by the cache of the remote DSC.

Figure 10:
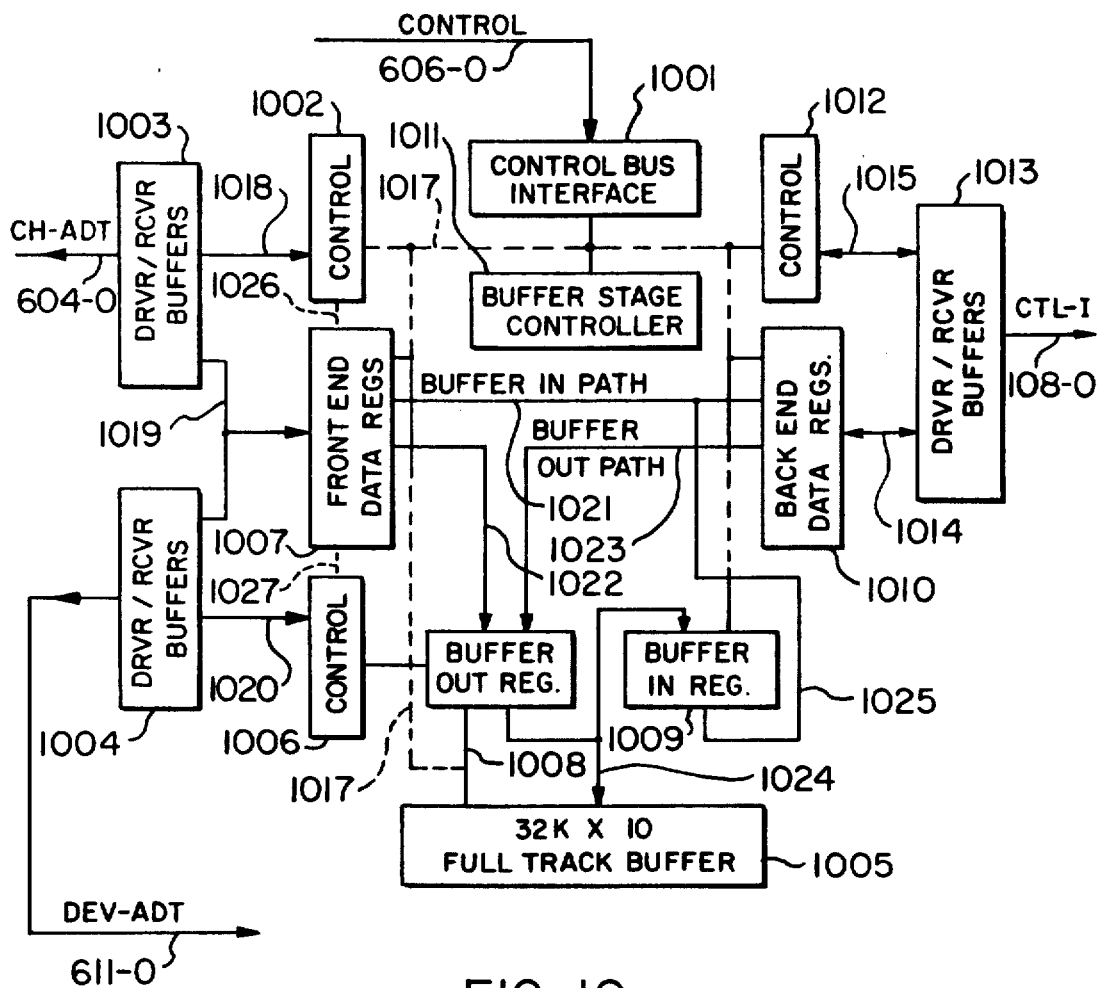
FIG. 10 discloses further details of the IBC element of FIGS. 6-8.

The IBC element on FIG. 10 includes a full track buffer 1005 that can store the entire contents of a disk drive track as well as control information. The IBC element is accessed at its front end by CH-ADT bus 604-0 and at its back end by CTL-I path 108-0. The ADT interfaces 1003 and 1004 and the device interface 1013 contain control logic that manipulates data streams that pass through the interfaces so as to meet count key data format requirements. The function of the IBC element is controlled by microprocessor 608 over path 606-0 which instructs the IBC element to configure itself and initiate data transfers. Information that the IBC element uses for configuring itself is stored in the full track buffer 1005.

The full track buffer 1005 is used for manipulating count key and data (CKD) fields as they pass through the IBC during synchronous data transfers. Microprocessor 605 writes and reads information from all registers of the IBC element.

Three ports comprise the data path through the IBC element. At the right side is the control interface (CTL-I port) which connects to one or more disk controllers 112. On the left side is the port to CH-ADT bus 604-0. The DEV-ADT port is connected over path 611-0 to cache memory 512.

The IBC element operates in two different modes. In a first mode, microprocessor 508 has read/write access to all registers within the IBC element and to the data stored within buffer 1005. In this mode, drivers 1003, 1004 and 1013 are disabled by allowing the microprocessor to run diagnostics internal to the IBC element without disturbing other hardware electrically connected to the IBC. The microprocessor 608 also uses this mode to prepare the IBC element for synchronous data transfers.

After microprocessor 608 has prepared the IBC element for a synchronous data transfer, it places the IBC element in the run mode. Control of the data transfer is then maintained by the buffer stage controller 1011. Controller 1011 monitors the data transfer and causes stage transitions to occur as the data transfer progresses. These stage transitions are necessary to support the CKD format.

Memories 612 are shared by microprocessors 608 and 613 within DSC 105. The memories may be 512 k by 36 bits, arranged as four 8-bit bytes with parity. There are two shared memories (612-0 and 612-1 in DSC 105. Redundancy is achieved by writing and reading simultaneously over two separate busses with the same data.

The shared memory 612 is memory mapped and control exists to enable the use of one or both of the shared memory busses 630 and 631. When reading, the data on both busses 630 and 631 is compared and an error is posted if a mismatch is detected. Microprocessor 508 performs the DSC 105 control functions. It consists of a dual commercial AMD 29000 processor, processor program and data memories, a shared memory interface, a local control bus interface, a maintenance interface and interrupt controller, a timer, and error checking and status logic.

Control busses 606-0 and 606-1 provide the communication path between microprocessor and other elements of DSC 105. Registers of elements connected to busses 606 are memory mapped into the microprocessor 608 address space. When these registers are accessed, the microprocessor bus cycle is held pending by inserting wait cycles until the bus is granted and the data transfer is completed.

The cache memory subsystem consists of all the elements necessary to perform high speed data storage and retrieval operations required. The cache controls read and write operations to VS 521 or NVS 520. It has an interrupt structure that notifies the appropriate microprocessor when a cache subsystem event requires service. It has diagnostic operations that test the functionality of the external interfaces, the internal busses, and error detection and reporting logic. It has a performance capability that monitors and reports when the software waits for cache resources and a field replaceable unit identification mechanism that permits the microprocessor to determine the size and configuration of the volatile and non-volatile memory.

Figure 11:
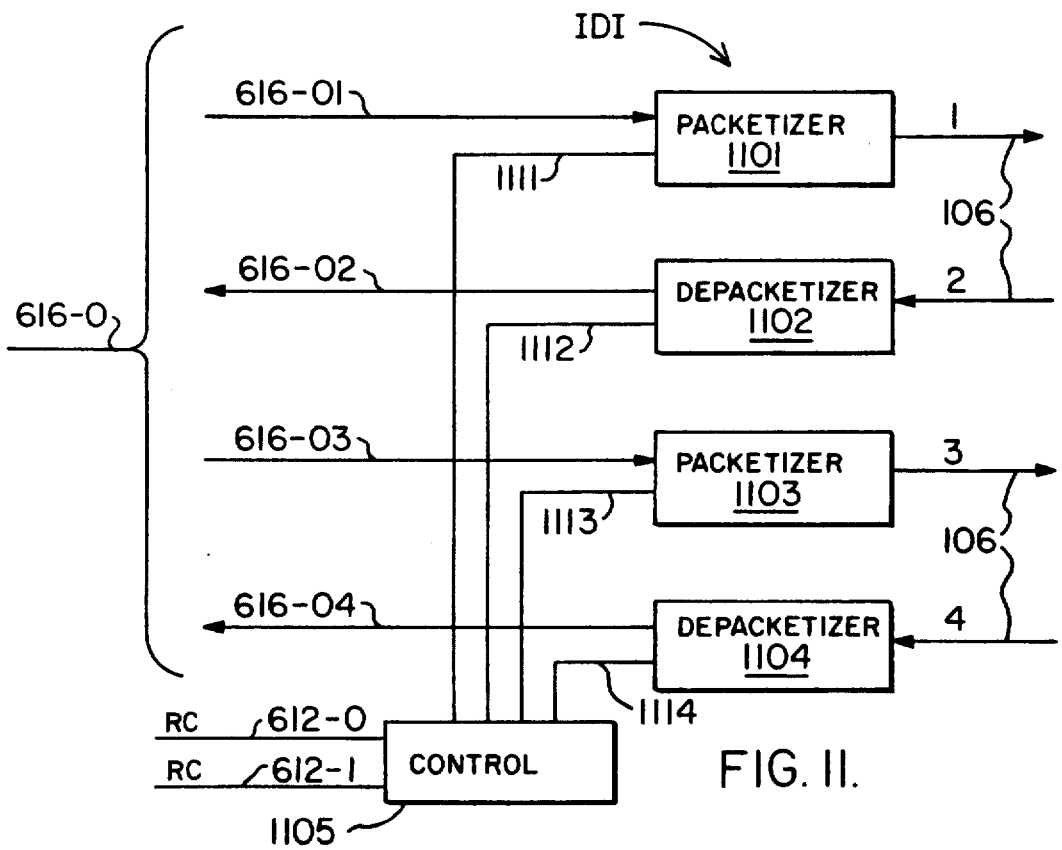
FIG. 11 discloses further details of the IDI elements 614 of FIG. 8.

FIG. 11—IDI Element

FIG. 11 discloses further details of IDI element 614 of FIG. 8. The connections to the IDI element of FIG. 11 are designated in the manner to facilitate their correspondence with the IDI element of FIG. 8. Data bus 616-0 on FIG. 11 corresponds to the like designated element on FIG. 8 and extends to cache memory 512. Similarly, the optical data link conductors have a group designation of 106-0 with the individual paths of this group being designated as 1, 2, 3 and 4. The RC conductors designated 612-0 and 612-1 of FIG. 8 extend on FIG. 11 to control element 1105.

The IDI element of FIG. 11 further comprises a packetizer 1101, a de-packetizer 1102, a second packetizer 1103 and a second de-packetizer 1104. Conductors 1111 through 1114 interconnect control element 1105 with the packetizers and de-packetizer elements. Packetizer 1101 operates under control of control element 1105 and receives data signals over data path 616-01. These signals are converted to a packetized format and extended as optical signals over path 1 of group 106-0 to the corresponding IDI element and a de-packetizer therein of another DSC. Packetizer 1103 operates in the same manner, it receives data signals on paths 616-03, it converts them to a packetized format and transmits them over path 3 of group 106-0 to a de-packetizer in a corresponding IDI element of the other DSC. De-packetizers 1102 and 1104 receive the packetized optical signals on paths 2 and 4, respectively, of group 106-0 and convert these signals to a standard data format and apply the converted signals to paths 616-02 and 616-04 of data bus 616-0.

Each packetizer/de-packetizer pair such as elements 1101 and 1102 can handle a bi-directional data communication. The two packetizers and the two de-packetizers shown on FIG. 11 permit data link 106-0 simultaneously to handle two independent data communications between the pair of DSCs interconnected by data link 106-0. The packetizers and de-packetizers on FIG. 11 include the necessary facilities, such as optical drivers and receivers, to communicate with optical paths 106.

Description of Channel Commands

The following describes the manner in which the system of the present invention, in particular DSC 105, responds to the reception from the host of unconventional channel program commands which are used to manage extended dual copy service. DASD channel program commands are well-known and are described in detail in Chapter 4 of an IBM publication GA 32-0099-3 entitled IBM 3990 Storage Control Reference, Fourth Edition (December 1989). The channel, such as 123-0, receives a start subchannel instruction from the host to start a channel program and then fetches a channel address word (CAW) for the program which is a four-byte word located in main storage of the host. The CAW contains the address of the first channel command word (CCW) in the chain of CCWs comprising the channel program which is located in the host memory. The channel responds to the start subchannel instruction and fetches the first CCW of the channel program from the address specified by the CAW. A CCW is eight bytes in length. One byte is an operation code that identifies the specified command. Three bytes specify the memory address of an associated parameter list or information involved in the operation.

After receiving the first CCW, the channel selects a specific peripheral storage device such as a particular disk drive 109, by sending the device address to DSC 105. If the selected disk drive 109 is available, the command code for the first CCW is sent to DSC 105 which returns an initial status byte to the channel indicating that the specified disk drive is available. If the selected device 109 indicates busy in the initial status byte, a signal is sent to the host indicating this and the command is issued again by the host a short time later. DSC 105 can execute a series of CCWs from a single start subchannel instruction by the activation of a flag bit in each CCW. This function is referred to as command chaining and is well-known. This function is also described in IBM document No. SA22-7085 entitled "IBM System/370 Extended Architecture Principles of Operation."

A path such as path 134-10 interconnects channel 123-0 with interface circuit ICI element 601-0. This path comprises an I/O interface path and it is described in detail in IBM publication GA 22-6974-09 entitled, "IBM System/360 and System/370 I/O Interface Channel to Control Unit Original Equipment Manufacturer's Information," 10th ed. (February 1988), © International Business Machine Corporations 1987. This publication discloses in detail the specific conductors that comprise an interface path such as 134-10. It further describes the details of the signals that are transmitted over the path conductors to control the DASD operations when information is written to and read from the disk drives. Since these details are well-known and are described fully in the aforementioned IBM publication, they are not set forth herein.

In a well-known manner, element ICI 601-0 and DSC 105 determine that a specified disk drive such as 109-5 is available and they return a signal back over interface path 134-10 to channel 123-0 indicating that the disk drive 109-5 is available. Having received this return signal, the host processor and the channel 123-0 cause the series of CCW commands about to be described to be transmitted over interface path 134-10 to ICI element 601-1 of DSC 105. Each command received by an ICI element is extended through ICC element 603-0 to microprocessor 608-0 and its shared memory 612 for processing and storage within memory 612. The ICC element 603-0 performs a data streaming function which is fully described in chapter 3 of the referenced IBM publication and need not be described in further detail herein.

DASD write requests are conventionally established by the transmission over the channel of a DEFINE EXTENT command followed by a LOCATE RECORD command followed by a WRITE command. The DEFINE EXTENT command performs a number of functions the main one of which is to define limits on operations which follow in the same channel program. The LOCATE RECORD command causes the head to be positioned to a specified cylinder, track, and sector number. The LOCATE RECORD command also causes the subsystem to search for a specified record starting with the specified sector. The WRITE command causes the specified disk drive to write the data transmitted immediately following the WRITE command to the disk drive. A read operation from a disk drive is controlled by the sequential transmission of a DEFINE EXTENT command, a LOCATE RECORD command and a READ command.

The DEFINE EXTENT command and the LOCATE RECORD command are each associated with a block of data comprising a parameter list which specifies information required by the DASD system to effect the system operation associated with each command. The parameter list for each command is transmitted to the DASD subsystem immediately following the channel command. The full sequence of channel commands and associated parameters and data transmitted on an exemplary DASD subsystem operation is:

DEFINE EXTENT command
    DEFINE EXTENT Parameter List
LOCATE RECORD command
    LOCATE RECORD Parameter List
WRITE DATA command
    DATA to be transmitted
READ COUNT KEY DATA
    DATA that is read FIG. 14 discloses a standard DASD channel program that writes the data field of a specified record of a specified disk drive and subsequently reads the count, key, and data fields of the record which immediately follows the record just updated. The program begins on line 1 when a channel address word (CAW) is fetched by the host channel. One field of this CAW is a pointer 1400 to the memory location of the first channel command word (CCW) (line 2) of the program. The fetching of the CAW of line 1 causes the channel program to start with the DEFINE EXTENT command of line 2. The format of the channel program command words is shown in lines 2–5 of FIG. 14. The left-most field comprises the operation code, the next field is a command chaining flag field (CCFL). Next is the count field; the right-most field is the data address field which is a pointer to the memory address of the parameter list or data associated with the command. The DEFINE EXTENT command of line 2 has an operation code of DX, a CCFL flag of 1 indicating that this command is not the last command of the channel program. The count field is 16 indicating the number of bytes in the DEFINE EXTENT Parameter List of line 6. The data address field contains the memory address location of the first byte of the DEFINE EXTENT Parameter List of line 6. This DEFINE EXTENT Parameter List is shown in line 6 with pointer 1401 indicating the relationship between the data address field of the DEFINE EXTENT command of line 2 and the address of the beginning byte of the DEFINE EXTENT Parameter List of line 6.

The DEFINE EXTENT command of line 2 is first sent to the DASD subsystem of FIGS. 6 through 8 and the DEFINE EXTENT Parameter List is next sent. The receipt of the DEFINE EXTENT command of line 2 and the DEFINE EXTENT Parameter List of line 6 causes the DASD system to perform the well-known system operations specified by the information of lines 2 and 6. Next, the LOCATE RECORD command of line 3 is sent to the DASD subsystem and immediately thereafter the LOCATE RECORD Parameter List of line 7 is sent. The DASD subsystem then effects the system operations associated with this information.

Next, the WRITE DATA command of line 4 is sent to the DASD subsystem and is followed by the data that is to be written which is symbolically shown in line 8. As subsequently described, and for other uses, the information of line 8 is termed a "REQUEST PACKET." The host next causes the READ COUNT KEY DATA command of line 5 to be transmitted to the DASD subsystem which then reads the count, key, and data fields of the next record on the same track and transmits this data of line 9 to the host. For other uses, the information of line 9 is termed a "RESPONSE PACKET." The foregoing describes how the host employs conventional DASD IBM 3990 channel program commands to cause data to be written and read by DSC 105.

Figure 14:
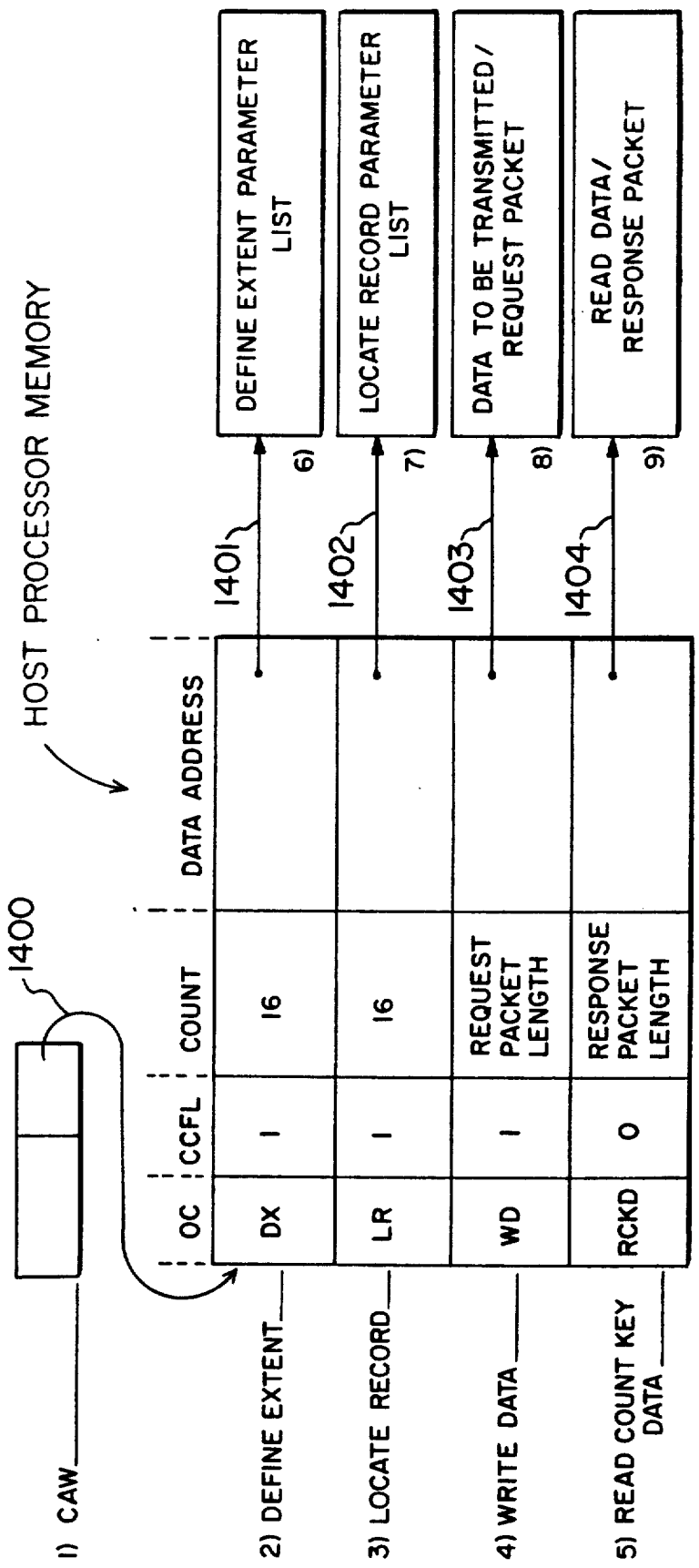
FIG. 14 discloses a channel program command sequence used to provide extended multiple copy service.

In accordance with the present invention, the host processor transmits a sequence of channel commands similar to that shown on FIG. 14 in order to instruct the DASD system to prepare itself for the provision of extended dual copy service to specified disk drives. For this extended dual copy service, the host transmits a sequence of channel commands comprising DEFINE EXTENT, LOCATE RECORD and WRITE DATA to the DASD system together with a parameter list and/or data for each such command. The transmitted parameter lists contents differ in specific ways from the aforementioned standard DASD commands, parameter lists and data. In order to prepare the system for the provision of extended dual copy service, the host transmits a series of channel commands comprising the DEFINE EXTENT command of line 2 of FIG. 14 followed by a DEFINE EXTENT Parameter List which is similar to that of line 6 of FIG. 14 but whose details are shown on FIG. 15. Next transmitted is the LOCATE RECORD command of line 3 of FIG. 14 followed by a LOCATE RECORD Parameter List similar to line 7 of FIG. 14 but whose details are shown on FIG. 16. Next transmitted is the WRITE DATA command of line 4 of FIG. 14 followed by a block of information similar to that of line 8 of FIG. 14 but which is interpreted by DSC 105 as a Request packet and whose details are shown on FIG. 17.

DSC 105 interprets the reception of the commands and information of FIGS. 14-17 as being a request from the host to prepare itself for the provision of extended dual copy service to a pair of specified volumes when the above-described standard DASD channel commands are subsequently received requesting the writing of a data record to the locally specified volume of DSC 105.

In the following description of FIGS. 15-17, the hexadecimal notation is indicated by a symbol such as X'9C' containing an X and two primes. With regard to the DEFINE EXTENT Parameter List of FIG. 15, the following Table 11 on page 11 of the aforementioned IBM 3990 Storage Control Reference publication specifies the format of the information represented by each field and the number of bytes comprising the size of each field.

TABLE 11

| Field # | Define Extent Command Parameters | |
|---|---|---|
| | Byte | Parameter |
| 0 | 0 | Mask byte |
| 1 | 1 | Global attributes |
| 2 | 2-3 | Block size in bytes |
| 3 | 4-5 | Cache fast write ID |
| 4 | 6 | Reserved, must be zero |
| 5 | 7 | Not used |
| 6 | 8-11 | Beginning of extent address |
| 7 | 12-15 | End of extent address |

Beginning on the left-most field and proceeding to the right on FIG. 15, the DEFINE EXTENT Parameter List transmitted by the host for the establishment of extended dual copy service comprises an X'9C' in the MB field 0, an X'E4' in the GA field 1, 0s in the BLS field 2, 0s in the CFWID field 3, 0s in fields 4 and 5, the beginning extent address (BEX-ADD) of the CE cylinder in field 6 and the end of the extent address (EEX-ADD) of the CE cylinder in field 7.

The details of the LOCATE RECORD Parameter List transmitted for the establishment of extended dual copy service are shown on FIG. 16. The following table 12 on page 72 of the last-mentioned IBM publication discloses the format of the fields of the LOCATE RECORD Parameter List for conventional DASD systems.

TABLE 12

| Field # | Locate Record Parameters | |
|---|---|---|
| | Byte | Parameter Name |
| 0 | 0 | Operation byte |
| 1 | 1 | Auxiliary byte |
| 2 | 2 | Reserved, must be zero |
| 3 | 3 | Count |
| 4 | 4-7 | Seek address |
| 5 | 8-12 | Search argument |
| 6 | 13 | Sector number |
| 7 | 14-15 | Transfer length factor |

FIG. 16 shows the contents of the LOCATE RECORD Parameter List transmitted for the present invention. The OB field 0 contains X'01'. The AB field 1 contains X'00'. Field 2 contains a 0. The COUNT field 3 contains X'01'. The SEEK ADDRESS (SADD) field 4 contains the address of the CE cylinder. The SEARCH ARGUMENT (SARG) field 5 contains X'C5C3C1D4FF' which is considered invalid by conventional DASD subsystems. The SECTOR NUMBER (S#) field 6 contains X'00', the TRANSFER FACTOR (TLF) field 7 contains X'FFFF'.

The details of the information block of line 8 of FIG. 14 is termed a Request packet when transmitted for the establishment of extended dual copy service and is shown on FIG. 17 and is transmitted to DSC 105. The MSG ID field 0 of the Request packet of FIG. X3 contains MECG 5 which stands for Manage Extended Copy Group. The REQUEST TYPE field 1 contains ESTB which stands for Establish Extended Dual Copy Service. The LV (local volume) field 2 contains a 3 indicating that disk drive 3 associated with DSC 105 is to provide extended dual copy service. The RV (remote volume) field 3a contains a 1 indicating that disk drive 1 of remote DSC 107 is to be paired with disk drive 3 of local DSC 105 for the provision of extended dual copy service by this pair of disk drives. The function of fields 3i through 3n are later described. The MESSAGE COMPLETION STATUS field 4 specifies the status of the completion of this request. It alternatively indicates either that the request was executed successfully or identifies a system trouble if it was not executed successfully.

The above-described transmission of the channel program commands of lines 2, 3 and 4 of FIG. 14 and the associated parameter lists of FIGS. 15, 16, and the request packet of FIG. 17 by the host causes DSC 105 to take the preparatory system actions required for the subsequent furnishing of extended dual copy service by local disk drive 3 and remote disk drive 1. Although the transmitted channel commands and parameter lists and request packet are similar to those used in conventional DASD subsystems for a write operation, the contents of the parameter lists of FIGS. 15 and 16 and the data block of FIG. 17 differ from those of standard DASD systems so that the combined receipt of the information shown on FIGS. 14–17 advises DSC 105 that this is not a standard request for execution of a conventional DASD write operation but, instead, is a request for the provision of extended dual copy service for local volume 3 paired with remote volume 1. Upon the subsequent receipt of a standard DASD write request specifying local volume 3, the record associated with this standard write request is written on both local volume 3 of DSC 105 and on remote disk drive 1 of DSC 107. The above-described commands are followed by a Read Count Key Data command of line 5 of FIG. 14 which causes DSC 105 to return a Response packet information block of line 9 of FIG. 14.

DSC 105 is now prepared to provide extended dual copy service on subsequent write requests received from the host specifying local disk drive 3. Subsequently, the host next transmits to DSC 105 the standard DASD program CCWs shown on FIG. 14 to cause a record to be written by both volume 3 of DSC 105 and remote volume 1 of DSC 107. As shown on FIG. 14, this standard program comprises the following command sequence:

The DEFINE EXTENT command of line 2,
The DEFINE EXTENT Parameter List of line 6,
The LOCATE RECORD command of line 3,
The LOCATE RECORD Parameter List of line 7,
The WRITE DATA command of line 4, and
The DATA to be transmitted of line 8.

In response to the receipt of these channel program commands, DSC 105 causes the data of line 8 of FIG. 14 to be written into disk drive 3 of the local DSC 105 and causes the same data to be written into disk drive 1 of remote DSC 107.

It should be appreciated from the foregoing that the system of the present invention causes extended dual copy service to be provided using standard DASD subsystem commands with the contents of certain fields of the parameter lists of FIGS. 15, 16 and the request packet of FIG. 17 being different from that of a standard DASD write operation. The transmission of the channel program of FIGS. 14–17 to a standard DASD subsystem would cause the standard subsystem to report an error condition back to the host since certain of the contents of certain fields of FIG. 16 violate standard DASD conventions even though they are in host-acceptable command format. It should also be appreciated that although the channel commands transmitted to the DASD subsystem of the present invention contain information illogical to a standard DASD subsystem, that once extended dual copy service is set up within DSC 105 by the aforementioned special DASD channel program, that standard DASD channel commands are subsequently used to control the writing and reading of data to the volumes specified for extended dual copy service.

In response to the receipt of the above-described write data command that contains the "manage extended copy group message" with the function code of establish an extended copy group (FIG. 17), the subsystem validates the parameters of the received commands, validates the state of the devices specified by the commands and determines that it is legal to establish an extended copy group consisting of the two identified volumes (local volume 3 and remote volume 1). When the validation is successful, DSC 105 begins the asynchronous process that causes the current contents of local volume 3 to be copied to remote volume 1. When that process begins, but before it is completed, the local DSC 105 responds to the read count-key data command of line 5 of FIG. 14 in the channel program with a response packet and an ending status signal to the host. The message completion status of this response packet normally indicates to the host that the request has been accepted and that the process of making volumes 3 and 1 identical has been initiated successfully. If anything is found to be invalid concerning this request or if the process of making volumes 3 and 1 identical cannot be initiated successfully, for example, because a data link 106 is not available, then instead of responding to the read count-key data command with a response packet indicating a successful initiation of the command, the DSC 105 responds to the host with a response packet indicating what exactly is the problem by the contents of the message completion status field.

At this point extended dual copy service is established within DSC 105. DSC 105 may then receive subsequent write commands of the FIG. 14 type for all of drives 109. The microprocessor 608 and the shared memory 612 look at the device address specified by each such write command and perform in the well-known manner to write the records if extended dual copy service has not been invoked on the drives specified by these commands. In other words, subsequent write requests to volumes not requiring extended dual copy service are processed in the normal way.

Subsequent write requests to a volume requiring extended dual copy service are processed by local DSC 105, in the normal manner insofar as writing a record written onto local volume 3. Let it be assumed that DSC 105 has received commands which specify the writing of a record to specified cylinder on a volume for which extended dual copy service is to be provided. When DSC 105 receives that command, it executes it in the well-known manner. The following describes what DSC 105 does to transmit information over IDIs 614 and the optical data links 106 to DSC 107 to cause it to generate an extended dual copy at the mated disk unit (volume 1) in DSC 107.

The way things generally work is that while the system is in the process of writing a modified data record onto the local disk device, a copy of the record is made in cache 512 of DSC 105. This copy of the modified record is transmitted over optical data link 106 to the cache of DSC 107. The request to write that modified record onto the remote volume of the extended dual copy pair is transmitted in advance of the modified data record. The remote disk control unit then writes the modified record from the cache of DSC 107 onto a disk 111 of DSC 107. When the writing process is complete, DSC 107 reports back over data link 106 to DSC 105 that the remote copy has been updated by DSC 107. That's the high-level view of one of the alternative ways that the system operates. This alternative that has just been described is termed extended dual copy. Next described is extended fast dual copy.

In extended fast dual copy, the record received by DSC 105 from the host is not immediately written to local disk drive 109. Instead, it is only retained in cache 512 of local DSC 105. This record is in both the VS and NVS portions of cache 512. The modified record is also transmitted over data link 106 to the cache of remote DSC 107 and is stored in its NV store. When the modified record has been stored in the NV store of remote DSC 107, that fact and the completion status of that storing is sent back over data link 106 to local DSC 105. When local DSC 105 is informed that the modified record has been written successfully to both its own cache 512 and its own local NV store and also to the remote NV store by the remote DSC 107, then local DSC 105 reports to the host that the modified record has been successfully received by both disk subsystems. The disk subsystems are then responsible for processing the received modified record. What this responsibility entails after having released the host, is the process of subsequently writing the modified record from cache 512 of local DSC 105 onto the appropriate disk drive 109 of the extended dual copy group and also the writing from the cache of the remote DSC 107 onto the appropriate one of a disk drive 111 which is the other member of the extended copy group pair of disk drives. When all of that has been completed, then all of the actions that must be taken to comply with the host request to update the record have been accomplished.

Next described is how the system of the invention executes read commands with everything working properly. When DSC 105 receives a read request it is necessary to understand whether the most current image of the virtual volume that has an extended dual copy implementation is contained within DSC 105 that received the read request or whether the most current image of that virtual volume is actually contained in remote DSC 107. The way that the most recent record version could be contained in remote DSC 107 is if a host attached directly to the remote DSC 107 were to have recently written an update of the record to the virtual volume in the remote DSC 107. Then that update may be in the process of being applied by the remote DSC 107 over data link 106 to the DSC 105 unit which now may be responding to a read request from the host for the record that has been priorly updated by the host to a volume of DSC 107.

In order to proceed with integrity with the read, DSC 105 must ascertain whether or not it owns the extended device lock or tag associated with the extended copy group. In order for a DSC which has received a read request from a host to be able to honor that read request, that DSC must be in possession of a token called the extended copy group lock for that particular virtual volume. The reason such a lock must exist is because only one of the DSCs at any one time may have the current responsibility for knowing exactly what the most recently updated state of the virtual volume is. That is to say, either of the two DSCs may from time to time receive and process requests from hosts attached to either of the two DSC units to write an update onto the virtual volume which is realized by the extended copy group. In order to write, it is necessary that the DSC that's going to write to the volume own the responsibility for the integrity of the volume during the write process. It's therefore necessary that the DSC that received the write request know that the other DSC is not at the same time also trying to write the same volume. So the first DSC has to obtain an extended copy group lock that is passed back and forth between the two DSCs upon the request of either one of them when the two DSCs require access to the volume. Not only is it necessary that this lock be owned by a DSC in order for it to provide write access to the volume, but it is also necessary that a DSC own the lock in order to provide read access. The reason that this is necessary is because if the local DSC did not own the lock, and the remote DSC were in the process of writing to the virtual volume, the local DSC could report to the host that was attempting to read this record while the remote DSC was trying to write the record. In that case, the local DSC would read the old version of that record while the host would have written an updated version of the record using the remote DSC and the update may not yet have been processed by the local DSC. In order to avoid that data integrity exposure, the extended copy group lock must be held by a DSC when that DSC is processing either a read or a write request from a host against the particular virtual volume. This is further described in detail on subsequent pages.

Next described is what happens when a host is attempting to read a record from the virtual volume that's implemented by an extended dual copy pair and something is inoperable. There are several possible cases of that. The first case described is where the thing that is inoperable is the physical disk drive of the local DSC the host is trying to read from. FIG. 1 shows two DSCs and one host. Normally the reads coming into DSC 105 on FIG. 1 would be processed through the appropriate one of disk drives 109. However, assume that the involved one of disk drives 109 is inoperable and is not available. Any number of problems could have made it impossible for DSC 105 to read the record that host wants to read off of the appropriate ones of disk drives 109. In any of these cases, DSC 105 determines that it can't read the record that the host wants from the appropriate one of its disk drives 109. Rather than involve the host in an error recovery procedure of any sort, DSC 105 communicates over data link 106 to DSC 107 that it wants to read the particular record that it couldn't read off of its local disk drive 109. In response to receiving this message over data link 106, DSC 107 reads from the appropriate one of disk drives 111 that is the extended dual copy pair of the drive 109 that cannot be read from. Assume the remote volume can be read. DSC 107 then transmits the record that is required by the host back over data link 106 to DSC 105. Actually, DSC 107 will not just transmit the one record that was asked for, but it transmits the entire track that contains the record that has been asked for. That track is then placed into cache 512 of DSC 105 as though it had been read from the appropriate one of disk drives 109. Host 101 is then given the data record from cache 512 of DSC 105 without knowledge that the record could not be read from a disk drive 109.

On FIG. 2, where the host is actually connected to both DSC 105 and 107, let it be assumed that one of disk drives 109 is broken. It is possible that the host could be asked to access the record over alternate channel path 104-1 and DSC 107 directly without involving DSC 105. However, the present invention does not contemplate doing it that way. Instead, if the record is readable over data link 106, then DSC 105 will cause the record read by DSC 107 and transmitted over the data link 106 back to DSC 105. The host is then given the record over channel interface 104-0 without the host having to further be involved in the error-recovery procedure.

Data Link Messages

The following describes the messages that are transmitted over data links 106 between the DSCs when extended dual copy service or extended multiple copy service is to be provided. It has priorly been described in connection with FIGS. 14 through 17 how commands are transmitted from the host to a local DSC over a channel interface path, such as 134-10, to prepare local DSC 105 for the provision of extended dual copy service when one or more write requests are subsequently received directed to a priorly specified volume (disk drive) of the local DSC 105. When such write requests are received, multiple copies of the record accompanying each write request are created by writing one copy of the record on the specified volume of local DSC 105 and by writing another copy of the record on a volume of remote DSC 107. The remote volume was originally specified in the channel program of FIGS. 14-17 that conditioned local DSC 105 for the subsequent provision of extended dual copy service. As shown on FIG. 17, it is assumed that extended dual copy service is to be provided by volume 3 of local DSC 105 and by volume 1 of remote DSC 107. This service will be provided for all subsequently received record write requests directed to volume 3 of DSC 105.

When each write data command is subsequently received that is directed to volume 3 of DSC 105, the command parameters are stored within microprocessor 608 and the shared memory 612 of DSC 105. The data comprising the record is applied over path 604-0 and stored in cache memory 512. At that time, microprocessor 608 and shared memory 612, working together, determine that the write request is directed to volume 3 of DSC 105 and that DSC 105 is to cooperate with DSC 107 to provide extended dual copy service for the record accompanying each such write request. Cache memory 512, microprocessor 608 and shared memory 612 cooperate to cause the control messages and data next described to be transmitted via one or more of IDI elements 614 and over one or more of data links 106 from DSC 105 to DSC 107.

Figure 18:
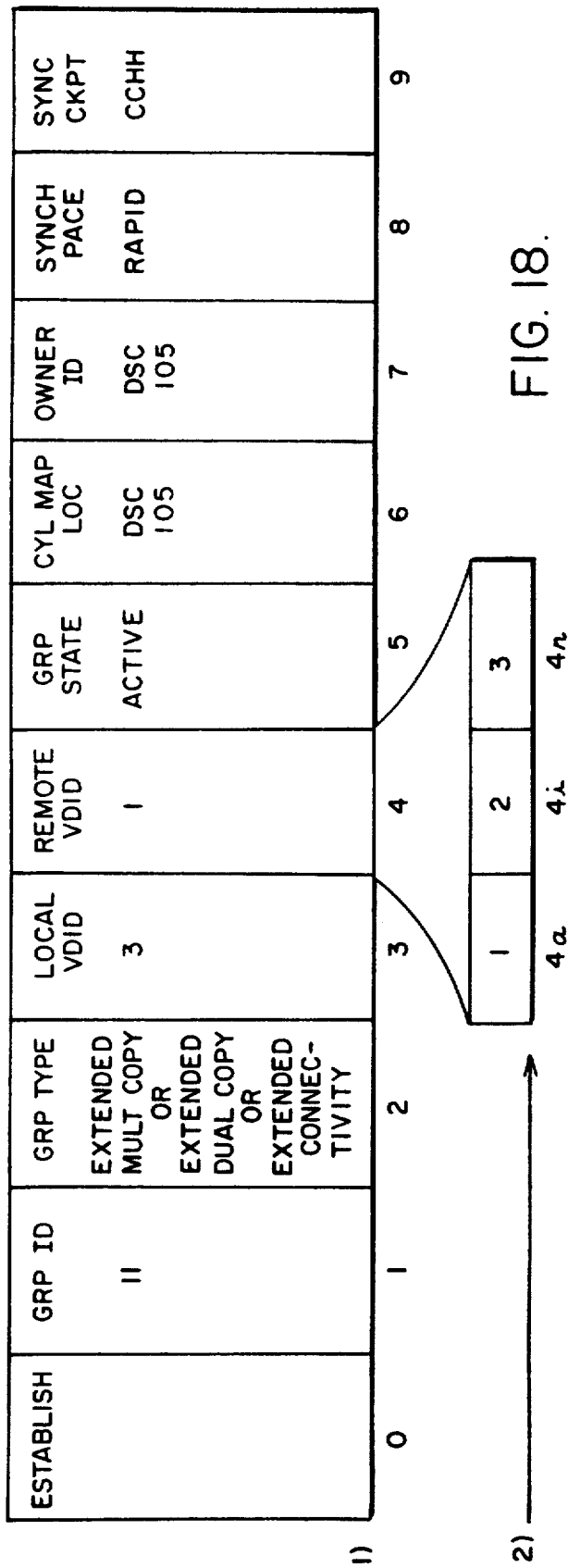

The message shown on FIG. 18 is the first in the sequence of messages that is transmitted over data link 106 for the provision of extended dual copy service for a record accompanying each subsequently received write data command directed to volume 3 of DSC 105. Field 0 contains the ESTABLISH opcode for the message. The GROUP I.D. field 1 contains an arbitrary number which identifies the group to be established. Let it be assumed that the GROUP I.D. is 11. The GROUP TYPE field 2 identifies the service to be provided for the group and is shown on FIG. 18 to be termed EXTENDED DUAL COPY. Other possible services are EXTENDED CONNECTIVITY and EXTENDED MULTIPLE COPY. These are described elsewhere in the present application. The LOCAL VDID field 3 identifies the local volume that is associated with the dual copy service and is shown to be 3 in FIG. 18. The REMOTE VDID field 4 identifies the volume of DSC 107 that is to be written to provide the extended dual copy service. FIG. 18 shows this to be volume 1 of DSC 107. The GROUP STATE field 5 identifies the state of the system with respect to the provision of extended dual copy service. FIG. 18 shows the state to be designated as being ACTIVE. Other possible system states which are not shown in detail can be SIMPLEX, PENDING, SUSPENDED, and CONDITIONAL. The CYLINDER MAP LOCATION field 6 indicates which DSC contains the modified cylinder bit map for the group. FIG. 18 shows this to be DSC 105. The OWNER ID field 7 indicates which DSC is the original owner of the extended group lock for the group. FIG. 18 shows this to be DSC 105. The SYNC PACE field indicates the rate at which the volumes of the group are to be synchronized. The term "synchronized" means that the two volumes are to be written so as to be identical. The pace is shown to be RAPID on FIG. 18. The SYNC CKPT field 9 contains the CCHH address of the last track of the group which has been priorly synchronized.

When local DSC 105 receives each request to write a record onto a volume priorly identified for extended dual copy service, DSC 105 may not already own what is termed the "extended copy lock" for the volume. If it does not own that lock, then it must request ownership of the lock from DSC 107 over data link 106. DSC 105 does this by sending a REQUEST OWNERSHIP MESSAGE of FIG. 19 to DSC 107 identifying the group for which it wishes to receive the lock. When DSC 107 receives the REQUEST OWNERSHIP message, and after it has finished the operations required of it in response thereto, it responds by transmitting a GRANT OWNERSHIP message of FIG. 19 to DSC 105. At that time, local DSC 105 owns the extended copy group lock for the group i.d. and it can proceed to cause a dual copy of the record to be written by local volume 3 and remote volume 1.

Figure 19:
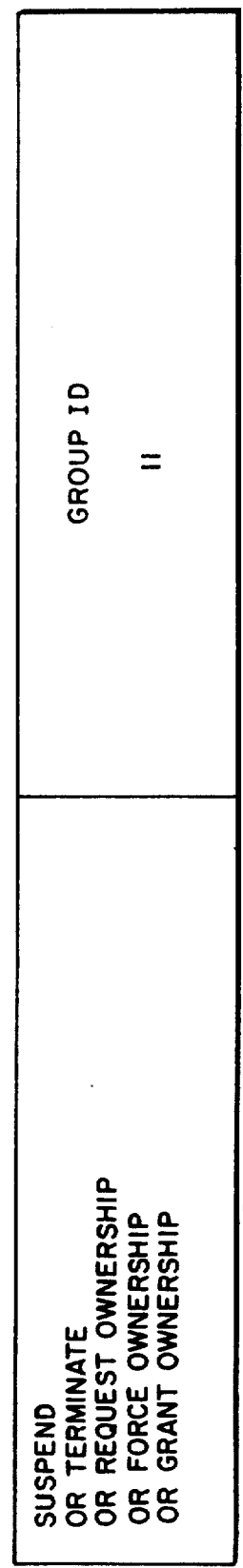

The message that is sent from DSC 105 to request ownership of the lock is shown on FIG. 19 in generalized form. Field 0 indicates various types of message. The opcode for these messages can be SUSPEND or TERMINATE or REQUEST OWNERSHIP or FORCE OWNERSHIP or GRANT OWNERSHIP. At this time, the opcode for the message transmitted by DSC 105 is REQUEST OWNERSHIP and the GROUP I.D. of field 1 is 11 to correspond to the GROUP I.D. of field 1 of the message of FIG. 18. Let it be assumed that DSC 107 relinquishes its ownership of the group lock and transmits a message of the type generally shown in FIG. 19 back to DSC 105. At this time, the opcode for the message is GRANT OWNERSHIP and the GROUP I.D. for the message is 11. Following the exchange of the REQUEST OWNERSHIP message followed by the receipt back of the GRANT OWNERSHIP message, DSC 105 owns the lock for extended copy group 11 and proceeds with the function of causing an extended dual copy of the record to be written. If DSC 107 had been unable to immediately grant ownership, it would have sent back a message of the type shown in FIG. 20 back to DSC 105. This message would contain an opcode of REFUSAL in field 0, a GROUP I.D. of 11 to identify the group involved and a REFUSAL code indicating the specific reason why DSC 107 refused the request. FIG. 20 also portrays the format of a message having an opcode of ACKNOWLEDGE in field 0, a GROUP I.D. in field 1 and an ACKNOWLEDGMENT return code in field 2. The function of the acknowledgment message is subsequently described.

Next, local DSC 105 transmits a message of the type shown in FIG. 21 over data link 106 to remote DSC 107. Messages of the type generally shown in FIG. 21 contain a number of alternative opcodes in its field 0. These are PERFORM DEBEVAGE or READ FROM BEVY REQUEST or READY TO RECEIVE DATA or READ FROM BEVY COMPLETE. The message that is transmitted at this time has the opcode of PERFORM DEBEVAGE in field 0. The GROUP I.D. field 1 contains an 11 to correspond to the GROUP I.D. of FIGS. 18 and 19. Field 2 of this message identifies the track on the particular disk drive of DSC 107 that is to be written. The TRACK ID is designated as DCCHH. The D identifies the device that is to be written. CCHH comprises the cylinder and track address on the identified device.

This message of FIG. 21 also contains a field termed CACHE RECORD DESCRIPTOR whose subfields are shown on line 2 of FIG. 21. Subfield 3 is a MODIFIED FIELD INDICATOR which indicates the fields of the record that have been modified in the cache memory of DSC 105. Subfield 4 contains an INTERNAL RECORD NUMBER which is the ordinal position of the record on the track. Subfield 5 contains the KEY OFFSET. Subfield 6 contains a DATA OFFSET. Both of these are the relative byte position from the beginning of the record that's going to be subsequently sent and indicates where the key field starts and where the data field starts. The DASD SEGMENT NUMBER of field 7 indicates the angular rotational position on the track where the record actually begins. The RECORD LOGICAL IDENTIFIER of fields 8, 9 and 10 is user controllable and comprises the CCHHR address information, the KEY LENGTH information and the DATA LENGTH of the count field that actually is going to be sent in a CKD transfer message as subsequently described.

In response to the reception of the PERFORM DEBEVAGE message of FIG. 21, the remote DSC 107 returns a message of the type shown in FIG. 21 and containing the opcode of READY TO RECEIVE DATA in its field 0. The information in the other fields of this message is identical to that for the PERFORM DEBEVAGE message as already described.

Figure 22:
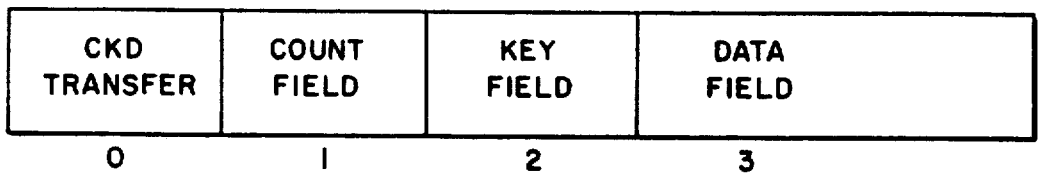

Local DSC 105 now transmits the CKD transfer message shown in FIG. 22 over data link 106 to DSC 107. This message contains the actual contents of the record that is to be written by volume 1 of DSC 107. This message contains the opcode of CKD TRANSFER in its field 0 and in fields 1, 2 and 3 contain the COUNT FIELD information, the KEY FIELD information and the DATA FIELD of the record that is to be written. The KEY FIELD is, of course, optional. In response to the transmission of the CKD TRANSFER message of FIG. 22, the remote DSC returns an ACKNOWLEDGMENT message of the type shown in FIG. 20. At this time, the opcode for the message is ACKNOWLEDGE to indicate that the CKD TRANSFER message of FIG. 22 was received by DSC 107.

Extended Multiple Copy Service

Figure 12:
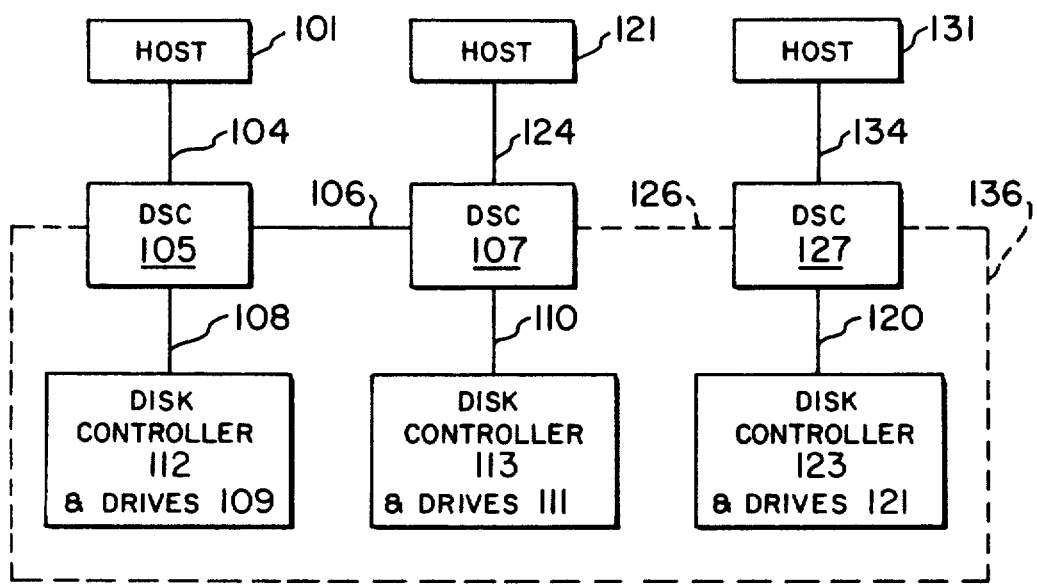
FIG. 12 discloses a system equipped to provide extended multiple copy services.

A system embodying the principles of the present invention can also be used as shown in FIG. 12 to provide extended multiple copy service where the number of copies to be provided is limited only by the number of separate DASD subsystems utilized. FIG. 12 discloses a plurality of DSCs 105, 107 and 127 interconnected by direct data links 106, 126 and 136. Paths 104, 124 and 134 connect the DSCs with a host computer individual to each DSC. Paths 108, 110 and 120 connect each DSC with a disk controller and disk drives such as disk controller 112 and disk drives 109 for DSC 105.

In accordance with the invention, DSC 105 may receive a command sequence of the type already described on FIG. 14 from its host processor 101 instructing it to provide extended multiple copy service for subsequently received write operations directed to a user specified volume identified in the command sequence that establishes the extended multiple copy service. Let it be assumed that a user at host 101 identifies volume 3 of local disk drives 109, remote volume 1 at remote disk drives 111 of DSC 107 and remote volume 2 of disk drives 121 serving DSC 127. DSC 105 receives this command sequence and prepares itself for the subsequent provision of extended multiple copy service in a manner analogous to that already described for the system operations associated with extended dual copy service.

Subsequently, let it be assumed that write commands are received identifying local volume 3 on a disk drive 109. In this case, DSC 105 responds to the receipt of each such write command identifying local volume 3 and transmits the received record together with accompanying control messages over direct data link 106 to DSC 107 which operates as priorly described for extended dual copy service. DSC 107 additionally transmits the received record and accompanying control messages over direct data link 126 to DSC 127 which operates in a manner similar to of DSC 107. DSC may further transmit the received record and associated control messages over data link 136 to DSC 105 which uses the received information as a check on the correct operation of DSCs 107 and 127. The individual DSCs 105, 107 and 127 may then operate in a manner similar to that priorly described to record the received data record on the disk drives associated with each such DSC.

The channel program used to establish extended multiple copy service is similar to that described for extended dual copy service. In this case, the request packet of FIG. 17 identifies the local volume in its field 2 and identifies the remote volumes for the various remote DSCs in its fields 3a, through 3i, through 3n where n equals the total number of DSCs. With respect to FIG. 18, the ESTABLISH message contains EXTENDED MULTIPLE COPY in its field 2 and in line 2 of FIG. 18 contains fields 4a, through 4i, through 4n with each such field identifying the volume in each DSC that is to be used to provide multiple copy service. With respect to FIG. 12 and line 2 of FIG. 18, field 4a identifies volume of DSC 107, field 4i identifies volume 2 of DSC 127 and field 4n identifies volume 3 of DSC 105. DSC 107 receives the described messages for extended dual copy service and operates to cause each received record to be written on its volume 1. DSC 107 also extends the received messages over data link 126 to DSC 127 which operates in a similar manner to cause a copy of the received record to be written by volume or disk drive 2 to which DSC 127 is connected. DSC 127 further extends the messages it receives over data link 136 back to DSC 105. The DSC 105 receives the messages over data link 136 and verifies that the system has performed as expected.

The system may also be operated so that copies of a record may need not be written by a drive of one or more DSCs in a system having n DSCs and n groups of disk drives This is accomplished by inserting a phantom or fictitious volume ID in the RV-field of the Request Packet of FIG. 17 for the DSC whose disk drives are not to write the received record and to insert the same phantom volume ID in the RV-field of the message of FIG. 18 for this DSC whose disk drives are not to write the received record.

Figure 13:
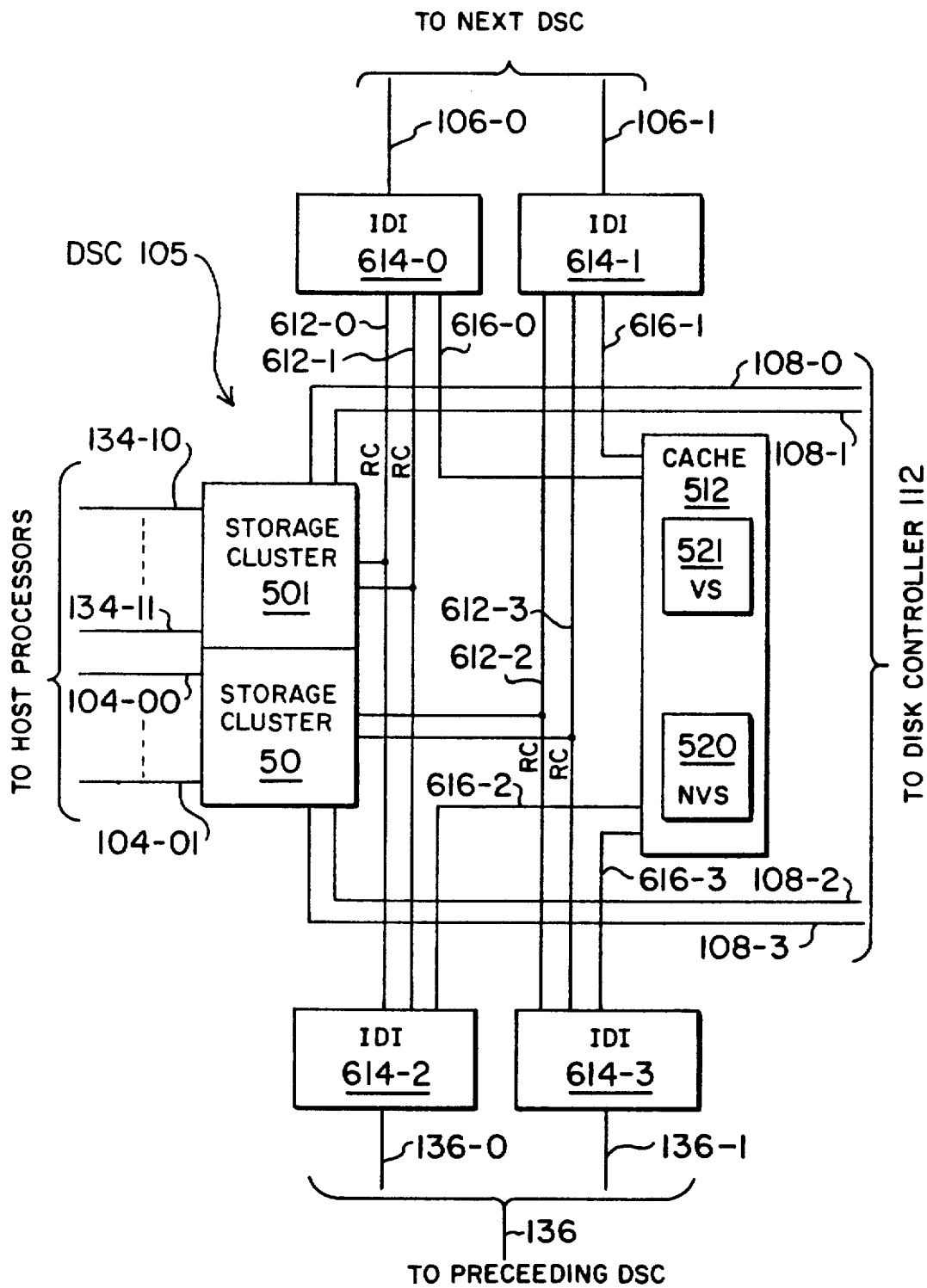
FIG. 13 discloses further details of a system equipped to provide extended multiple copy service.

Description of FIG. 13

FIG. 13 discloses further details of a DSC, such as DSC 105 of FIG. 12, equipped for the provision of extended multiple copy service for the generation of more than two copies for each write request received by a DSC, such as DSC 105, for a priorly specified local volume at DSC 105.

The details of the DSC 105 of FIG. 13 is generally similar to the DSC 105 equipped for extended dual copy service and shown in detail on FIGS. 6 through 8. This being the case, FIG. 13 discloses only the details of DSC 105 that differ from the disclosure of FIGS. 6 through 8.

As is the case on FIGS. 6 through 8, DSC 105 on FIG. 11 is equipped with a pair of IDI elements 614-0 and 614-1 which extend over direct data link paths 106-0 and 106-1 to the next DSC such as, for example, DSC 107 as shown on FIG. 12. The connections to these two IDI elements are identical to that shown on FIGS. 6 through 8. In addition, DSC 105 of FIG. 11 contains a pair of IDI elements 614-2 and 614-3 which are connected over paths 136-0 and 136-1 of data link 136 to a preceding DSC such as, for example, DSC 127 as shown on FIG. 12. IDI elements 614-2 and 614-3 are connected to the same RC conductors 612-0, 612-1, 612-2 and 612-3 as are IDI elements 614-0 and 614-1. In addition, IDI elements 614-2 and 614-3 are connected over data paths 616-2 and 616-3 to cache memory 512. These two additional IDI elements communicate with cache 512 in the same manner as do IDI elements 614-0 and 614-1 over data paths 616-0 and 616-1.

DSC 105 responds to commands similar to those priorly described to prepare itself for the provision of extended multiple copy service to a user-specified local volume 109 associated with DSC 105. Subsequently, when write requests are received that are directed to this specified local volume, DSC 105 and cache memory 512 transmit the appropriate messages and commands via an IDI element 614 to the next DSC, such as DSC 107, over data links 106-0 and 106-1. This record and the associated commands are received by DSC 107 by its IDI elements corresponding to IDI elements 614-2 and 614-3 of FIG. 13. The received record data and command signals are applied to the cache memory of DSC 107 and to its microprocessor and memory corresponding to microprocessor 608 and memory 612 of DSC 105. These elements together jointly cause the received data record to be written on a priorly specified remote volume 111 of DSC 107.

DSC 107 also operates to extend the received record and associated commands via its IDI elements corresponding to elements 614-0 and 614-1 of FIG. 11 and over a data link such as data link 126 on FIG. 12 to DSC 127. DSC 127 receives these commands and data record on its IDI elements corresponding to elements 614-2 and 614-3 of FIG. 13. The cache memory, the microprocessor and the memory of DSC 127 then together cooperatively cause the received record to be recorded on a priorly specified volume of a disk drive 121.

DSC 127 then extends the received control messages out over data link 136 and back to DSC 105 where the received information is received by IDI elements 614-2 and 614-3 over data link 136. The received control messages are applied via the RC leads and via the ICA elements 607 of FIG. 7 to microprocessor 608 and memory 612. The microprocessor and the memory process the received information as a verification of the correct operation of the other DSCs in the system of FIG. 12.

Extended Connectivity Service

The following describes the manner in which the system of the invention operates to transmit messages between DSC 105 and DSC 107 when EXTENDED CONNECTIVITY service is to be provided by the system of FIG. 4 for users of host processors 101 and 121. In this configuration some but not all of the records generated by users at each host processor are to be shared and written on only a specified disk drive 111 of DSC 107 so that users at these two host processors can jointly have access to the records written by both sets of users on the specified disk drive 111. It should be understood that a disk drive 109 associated with DSC 105 does not write these jointly shared records for the EXTENDED CONNECTIVITY service of FIG. 4.

The process begins when a channel program similar to that shown on FIGS. 14 through 17 is received by DSC 105 to establish EXTENDED CONNECTIVITY service. The command sequence is of the type shown on FIG. 14. However, the REQUEST PACKET of FIG. 17 contains different data in certain fields to condition DSC 105 to provide the EXTENDED CONNECTIVITY service for subsequently received write requests directed to a specified volume of DSC 105. Specifically, field 0 of FIG. 17 contains MECG 6. Since a volume of DSC 105 is not to be written with a record accompanying such a subsequently received write request, the local volume identification in FIG. 17 field 2 identifies a phantom volume of DSC 105 having no physical correspondence in disk drives 109. Field 3 of FIG. 17 identifies the volume 111 of DSC 107 that is to be written when the user at a host processor 101 generates such a subsequently received write request. In other words, DSC 105 is conditioned by the receipt of the command sequence shown in FIGS. 14 through 17 to write a record accompanying each subsequently received write request directed to the phantom volume of DSC 105 to the specified remote volume 111 of DSC 107.

DSC 105 receives each such subsequently received write request from a user at host processor 101 and transmits the message sequence about to be described over data link 106 to DSC 107. Since the subsequently received write request identifies the phantom volume of DSC 105, no disk drive 109 writes the received record. The message of FIG. 18 is first sent over the data link as priorly described. The only difference is that field 2 of FIG. 18 now specifies EXTENDED CONNECTIV- ITY service rather than EXTENDED MULTIPLE COPY or EXTENDED DUAL COPY SERVICE. DSCs 105 and 107 exchange the REQUEST OWNERSHIP and GRANT OWNERSHIP messages of FIG. 19 in order to ensure that the extended copy group lock is owned by the DSC that is processing the current channel program. The REFUSAL message of FIG. 20 is transmitted in the event that the DSC that is to give up ownership of the extended copy group lock cannot release ownership immediately. The PERFORM DEBEVAGE message of FIG. 21 is then transmitted by DSC 105 to DSC 107. DSC 107 responds with the READY TO RECEIVE DATA message of FIG. 21. The CKD transfer message of FIG. 22 is then transmitted over data link 106 to DSC 107. This message contains the record information that is to be written by the specified volume 111 that has been priorly identified and selected for use for this jointly shared data. DSC 107 receives the message of FIG. 22 and responds with the acknowledgment message of FIG. 20 which is returned over the data link 106 to DSC 105. Once a record or records generated by users of host processor 101 are written to the specified volume 111 of DSC 107, the contents of this volume may be jointly shared and read in the conventional manner by users at host processor 121 in the same manner as these users can read any of the volumes 111 connected to DSC 107. The users at host processor 101 can read the jointly shared volume 111 by transmitting a standard read command sequence directed to the priorly specified phantom volume of DSC 105. DSC 105 receives this command sequence and transmits the READ FROM BEVY REQUEST message of FIG. 21 over the data link 106 to DSC 107 to cause DSC 107 to read the requested record and transmit it back over the data link 106 to DSC 105. DSC 105 then applies the received record to the users of host processor 101 in the conventional manner.

Exchange of System Commands & Messages

Figure 23:
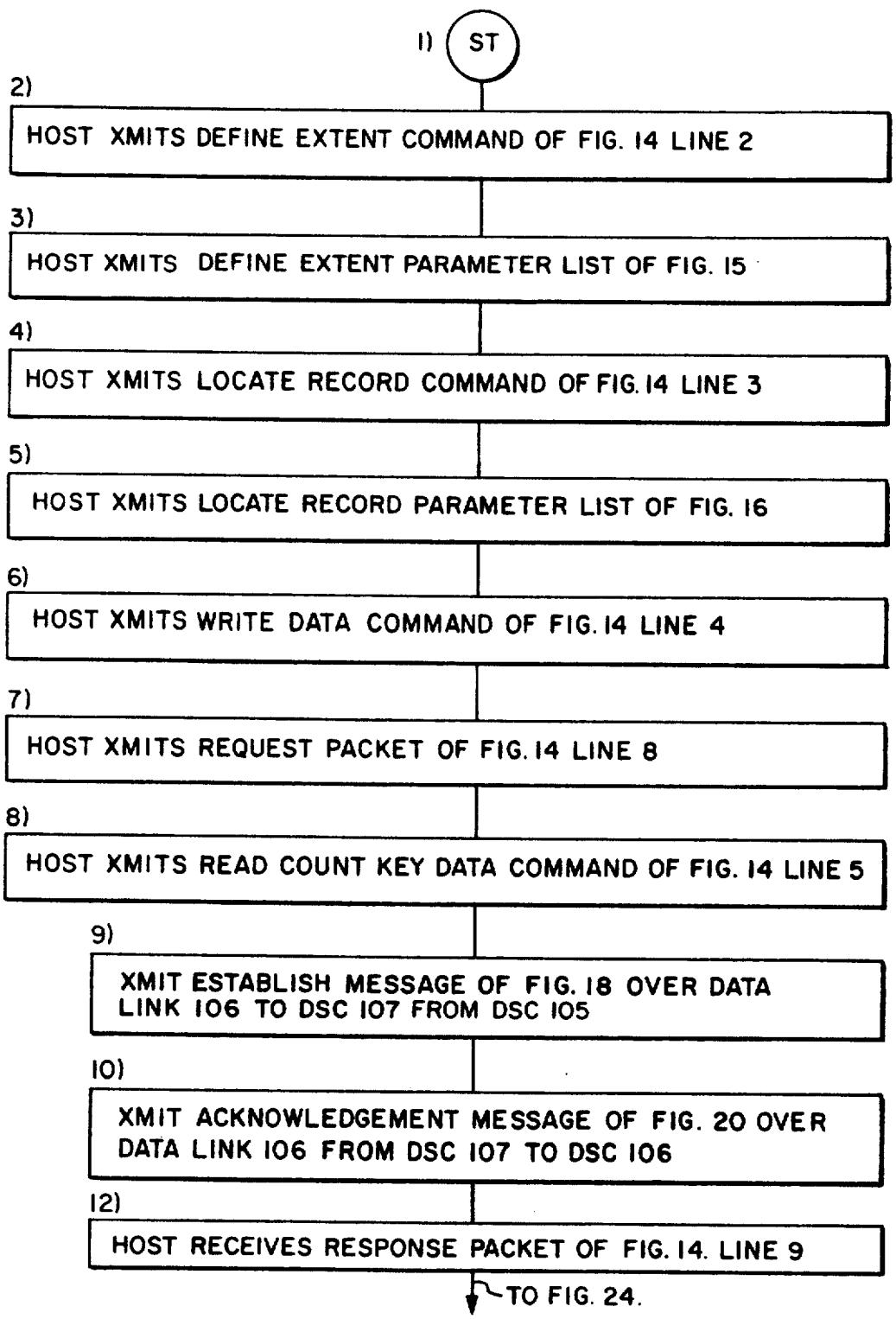
FIGS. 23-25 disclose the messages and commands exchanged between system elements for the provision of extended dual copy service.
Figure 24:
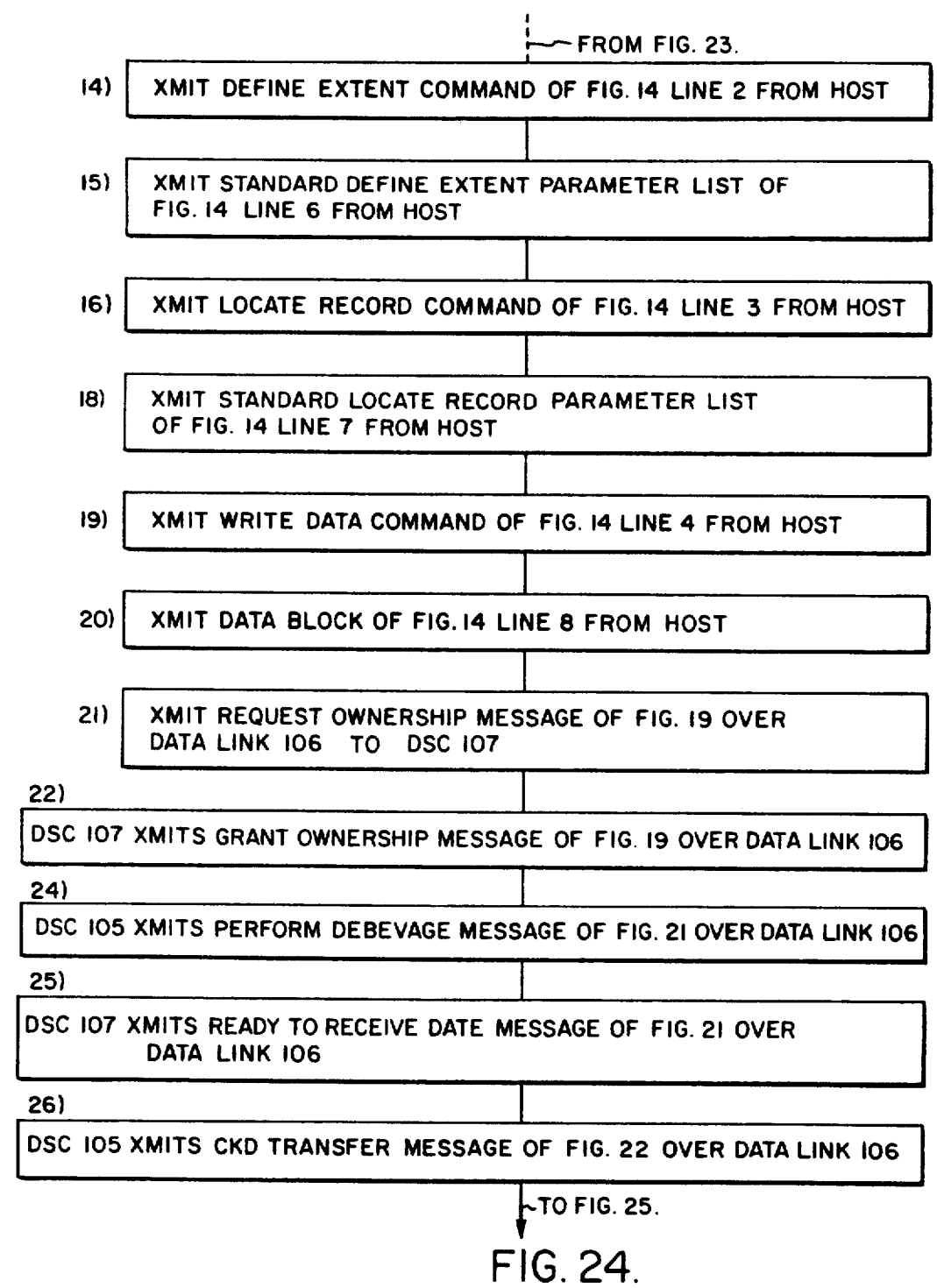
Figure 25:
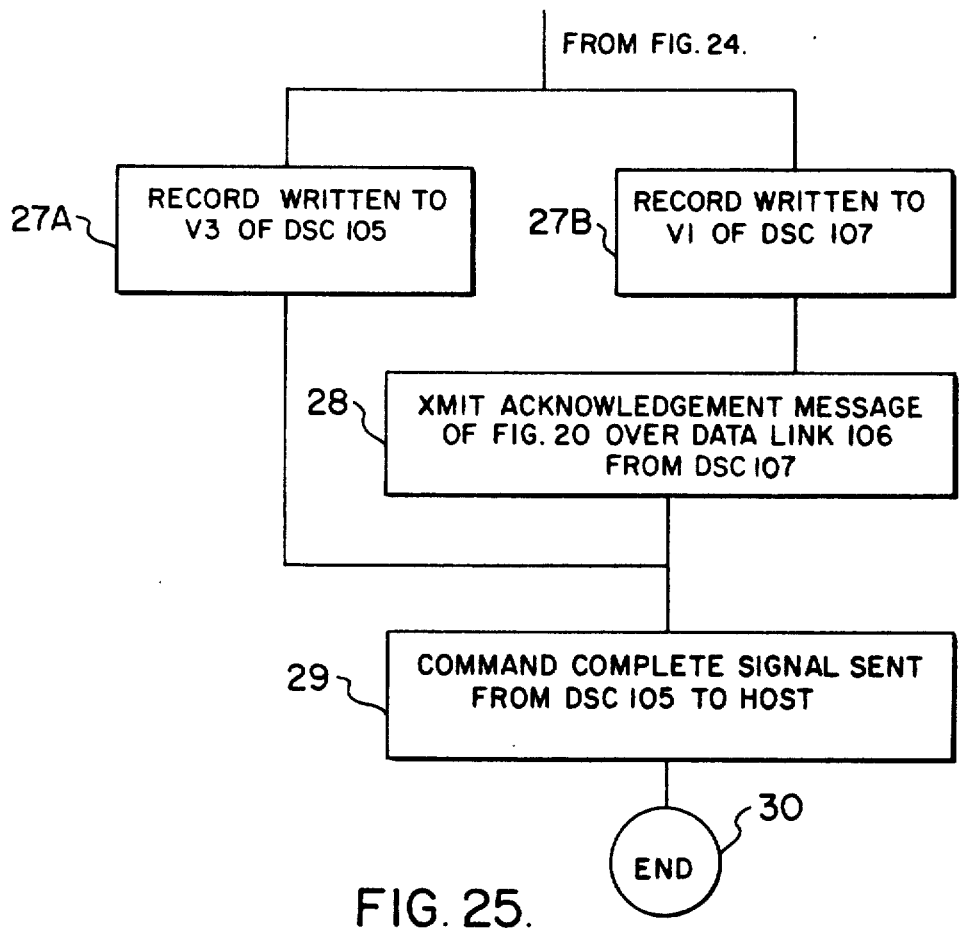

The sequence of system actions associated with the establishment of extended dual copy service followed by the writing of a data record to a volume specified for extended dual copy service is shown on FIGS. 23-25. The process begins in element 1 and proceeds to element 2 in which the host transmits a DEFINE EXTENT command of FIG. 14 line 2 over the channel to DSC 105. In element 3 the host transmits the DEFINE EXTENT Parameter List of FIG. 15 to DSC 105. In element 4 the host transmits a LOCATE RECORD command of FIG. 14 line 3 to DSC 105. In element 5 the host transmits the LOCATE RECORD Parameter List of FIG. 16 to DSC 105. In element 6 the host transmits the WRITE DATA command of FIG. 14 line 4 and in element 7 the host transmits the REQUEST PACKET of FIG. 17 to DSC 105. In element 8 the host transmits the READ COUNT KEY DATA command of FIG. 14 line 5 over the channel interface path to DSC 105. In element 9 the ESTABLISH message of FIG. 18 is transmitted from DSC 105 to DSC 107 over data link 106. In element 10 the ACKNOWLEDGMENT message of FIG. 20 is transmitted over data link 106 from DSC 107 to DSC 105. In element 12 DSC 105 transmits a RESPONSE PACKET of FIG. 14 line 9 to the host as an acknowledgment that the preceding commands, parameter lists, and information have been received.

At this time, both DSC 105 and DSC 107 are conditioned to provide extended dual copy service for subsequent write requests from the host directed to volume 3 of DSC 105. When such requests are received, as subsequently described, copies of the record accompanying each such received write request will be made by both volume 3 of DSC 105 and volume 1 of DSC 107.

Subsequently, the host transmits the channel program command sequence required to write a record using the already established extended dual copy service. Specifically, in element 14 the host transmits the standard DEFINE EXTENT command of FIG. 14 line 2. In element 15 the host transmits the standard DEFINE EXTENT Parameter List of FIG. 14, line 6. In elements 16 and 18 the host transmits the LOCATE RECORD command of FIG. 14 line 3 followed by the standard LOCATE RECORD Parameter List of FIG. 14 line 7. In element 19 the host transmits the WRITE DATA command of FIG. 14 line 4 followed by element 20 which transmits the DATA BLOCK to be written of FIG. 14 line 8.

In element 21, DSC 105 transmits the REQUEST OWNERSHIP message of FIG. 19 over data link 106 to DSC 107. In element 22, DSC 107 acknowledges the receipt of the REQUEST OWNERSHIP message and if it is able to pass the lock or token back to DSC 105 at this time it does this by transmitting the GRANT OWNERSHIP message of FIG. 19 over data link 106 back to DSC 105. Next, in element 24, DSC 105 transmits the PERFORM DEBEVAGE message of FIG. 21 over data link 106 to DSC 107. Next, in element 25, DSC 107 responds by transmitting the READY TO RECEIVE DATA message of FIG. 21 back over data link 106 to DSC 105. At this time, DSC 105 knows that DSC 107 is ready to receive data. Accordingly, in element 26, DSC 105 transmits the CKD TRANSFER message of FIG. 22 over data link 106 to DSC 107. This message contains the record data that is to be written by volume 1 of DSC 107.

At this time the record data received with the write request remains within the cache memory of each of DSCs 105 and 107 and has not as yet been written by volume 3 of DSC 105 or volume 1 of DSC 107. Next, in element 27A, DSC 105 causes the received record data to be written by its volume 3 and concurrently therewith in element 27B, DSC 107 causes the received record data to be written by its volume 1. In element 28, DSC 107 acknowledges the receipt of the CKD transfer message by transmitting an ACKNOWLEDGMENT message of FIG. 20 over data link 106 back to DSC 105. In element 29, DSC 105 returns a COMMAND COMPLETE signal over the channel interface path back to the host indicating that the requested extended dual copy write service has been successfully furnished since the data record received with the write command has been written by both volume 3 of DSC 105 and volume 1 of DSC 107.

The above sequence of commands describes extended dual copy service insofar as concerns the time at which the command complete signal is returned to the host processor. For extended fast dual copy service, the process is identical to that above-described except that the COMMAND COMPLETE signal is sent back to the host when the received record information is received and acknowledged by the remote DSC 107. Local DSC 105 and remote DSC 107 cause the received record information to be written on local volume 3 and remote volume 1 subsequent to the time the command complete signal is returned to the host.

While preferred embodiments of the present invention have been shown, it is to be expressly understood that modifications and changes may be made thereto and that the present invention is set forth in the following claims.

We claim:

1. In a data storage system adapted to be connected to a host computer, said system comprising:

a first independently operable data storage control, a second independently operable data storage control, a first recording means comprising a plurality of different recording elements connected to said first data storage control and a second recording means comprising a plurality of different recording elements connected to said second data storage control, each of said data storage controls being operable independently of each other to effect the writing of a data record by a specified one of the plurality of recording elements to which each said data storage control is connected, a data link transmission path interconnecting said first and second data storage controls, means in said first data storage control for receiving a command from said host computer requesting that an accompanying data record for each subsequent data record write request directed to a first recording element of said first recording means be written by said first recording element of said first recording means as well as by a first recording element of said second recording means, means in said first data storage control for receiving from said host computer a write request and an accompanying data record requesting that said accompanying data record be written by a specified recording element of said first recording means, means unique to said first data storage control and operable independently of said second data storage control and responsive to the reception of said write request and accompanying data record for effecting the writing of said data record by said specified recording element of said first recording means, means in said first data storage control further responsive to the receipt of said write request and said accompanying data record when said specified recording element of said first recording means comprises said first recording element of said first recording means for transmitting said write request and said accompanying data record over said data link transmission path to said second data storage control, and means unique to said second data storage control and operable independently of said first data storage control and responsive to the receipt of said write request and said accompanying data record over said data link transmission path for effecting the writing of said data record by said first recording element of said second recording means.

2. The system of claim 1 wherein said data link transmission path comprises a direct connection between said first an second data storage controls that is devoid of switching means.

3. The system of claim 1 in combination with:

a third data storage control connected to a third recording means comprising a plurality of different recording elements, a second data link transmission path connecting said second data storage control with said third data storage control, means in said second data storage control responsive to the receipt of said write request and said accompanying data record for transmitting said write request and said accompanying data record over said second data link transmission path to said third data storage control, and means unique to said third data storage control and operable independently of said first data storage control and said second data storage control and responsive to the reception of said write request and accompanying data record over said second data link transmission path for effecting the writing of said data record by a first recording element of said third recording means.

4. The system of claim 1 wherein each of said data storage controls contains a cache memory, means in each data storage control responsive to the receipt of said data record by said each data storage control for entering said received data record into the cache memory of said each data storage control, means for returning a command complete signal to said host computer from said first data storage control when said data record is entered into said cache memory of each data storage control, and wherein said means for effecting the writing of said data record comprises means for applying said data record in each cache memory to the recording means connected to the data storage control containing said each cache memory to control the writing of said data record by said first recording element of said recording means of each data storage control.

5. The system of claim 1 wherein a command complete signal is returned by said first data storage control to said host computer after said data record is written by said first recording element of said recording means of each data storage control.

6. The system of claim 1 wherein said means in said first data storage control for receiving said write request and accompanying data record comprises a first path extending from said host computer to said first data storage control for the reception of information including write requests and accompanying data records from said host computer; said system further comprising:

a second path extending from said host computer to said second data storage control for the transmission of information including write requests and accompanying data records from said host computer to said second data storage control, said second data storage control being responsive to the receipt of said write requests and accompanying data records over said second path to effect the writing by said first recording element of said second recording means of said data records received over said second path.

7. The system of claim 6 wherein said data link transmission path comprises a direct connection between said first and second data storage controls that is devoid of switching means.

8. The system of claim 6 in combination with:

means in second data storage control further responsive to said receipt of said write requests and accompanying data records received over said second path for transmitting said write requests and accompanying data records over said data link transmission path to said first data storage control, and means in said first data storage control responsive to said receipt of said write requests and accompanying data records over said data link transmission path to effect the writing by said first recording element of said first recording means of said records received by said first data storage control over said data link transmission path.

9. The system of claim 8 wherein said data link transmission path comprises a direct connection between said first and second data storage controls that is devoid of switching means.

10. The system of claim 8 wherein each of said data storage controls contains a cache memory, means in each data storage control responsive to the receipt of a write request and accompanying data record over said path connected to said data storage control for entering said received data record into the cache memory of said data storage control that received said write request and data record over said path, means for returning a command complete to said host computer from the data storage control that received said write request and data record from said host computer when said data record is entered into said cache memory of each data storage control, and wherein said means for effecting the writing of said data record comprises means for applying said data record in each cache memory to the recording means connected to the data storage control containing said each cache memory to control the writing of said data record by said first recording element of said recording means.

11. The system of claim 9 wherein a command complete signal is returned to said host computer by a data storage control that receives a data record from said host computer after said data record is written by each of said first recording elements of said recording means.

12. In a data storage system adapted to be connected to a host computer, said system comprising:
a first independently operable data storage control,
a second independently operable data storage control,
a first group of disk drives connected to said first data storage control and a second group of disk drives connected to said second data storage control,
each of said data storage controls being operable independently of each other to effect the writing of a data record by a specified one of the disk drives to which said each data storage control is connected,
a data link transmission path interconnecting said data storage controls,
means in said first data storage control for receiving data record write requests from said host computer,
means unique to said first data storage control and operable independently of said second data storage control and responsive to the reception of a data record write request and an accompanying data record for effecting the writing of said received data record by said first group of disk drives, means in said first data storage control for receiving a command sequence from said host computer requesting that multiple record copies be written for subsequently received record write request directed to a specified one of said disk drives of said first group of disk drives, means in said first data storage control responsive to the subsequent receipt of a record write request and an accompanying data record directed to said specified one disk drive for transmitting said received record accompanying said write request over said data link transmission path to said second data storage control, means unique to said first data storage control and operable independently of said second data storage control and further responsive to said subsequent receipt of said record write request for effecting the writing of said accompanying record by said specified one disk drive of said first group, and means unique to said second data storage control and operable independently of said first data storage control and responsive to the reception of said record over said data link transmission path for effecting the writing of said record by a disk drive of said second group.

13. The system of claim 12 wherein said data link transmission path comprises a direct connection between said data storage controls that is devoid of switching means.

14. The system of claim 12 in combination with:
a third data storage control connected to a third group of disk drives,
a second data link transmission path connecting said second data storage control with said third data storage control,
means in said second data storage control responsive to the receipt of said record for transmitting said record over said second data link transmission path to said third data storage control, and
means unique to said third data storage control and operable independently of said first data storage control and said second data storage control and responsive to the receipt of said record over said second data link transmission path for effecting the writing of said record by a disk drive of said third group of disk drives.

15. The system of claim 12 wherein each of said data storage controls contains a cache memory,
means in each data storage control responsive to the receipt of a record by said each data storage control for entering said each received record into the cache memory of said each data storage control,
means for returning a command complete signal to said host computer from said first data storage control when a record received by each data storage control is entered into said cache memory of said each data storage control, and
wherein said means for effecting the writing of said record comprises means for applying said record in each cache memory to a disk drive connected to the data storage control containing said each cache memory to control the writing of said record by said disk drive.

16. The system of claim 12 wherein a command complete signal is returned to said host computer by said first data storage control after said record is written by a disk drive of each of said groups.

17. The system of claim 12 wherein said means in said first data storage control for receiving said record comprises a first path extending from said host computer to said first data storage control for the reception of information including data records from said host computer; said system further comprising:
- a second path extending from said host computer to said second data storage control for the transmission of information including data records to said second data storage control,
- means in said second data storage control for receiving a data record write request over said second path from said host computer,
- means in said second data storage control responsive to the receipt of each received data record write request and an accompanying data record for effecting the writing of said accompanying data record by said second group of disk drives,
- means in said second data storage control for receiving a command sequence from said host computer requesting that multiple record copies be written for subsequently received data record write request directed to a specified one of said disk drives of said second group of disk drives,
- means in said second data storage control responsive to the subsequent receipt of a data record write request and accompanying data record directed to said specified one disk drive of said second group for transmitting said received record over said data link transmission path to said first data storage control,
- means unique to said second data storage control and operable independently of said first data storage control and further responsive to said subsequent receipt of said record write request and accompanying data record for effecting the writing of said received record by said specified one disk drive of said second group, and
- means unique to said first data storage control and operable independently of said second data storage control and responsive to the receipt of said record over said data link transmission path for effecting the writing of said record by a disk drive of said first group of disk drives.

18. The system of claim 17 wherein each of said data storage controls contains a cache memory,
- means in each data storage control responsive to the receipt of a record by said each data storage control for entering said received record into the cache memory of said each data storage control,
- means for returning a command complete signal to said host computer from said data storage control that receives a record from said host computer when said record is entered into said cache memory of each data storage control, and
- wherein said means for effecting a writing of each record comprises means for applying a record in each cache memory to a disk drive connected to the data storage control containing said each cache memory to control the writing of said record by said disk drive.

19. In a data storage system adapted to be connected over channel interface paths to a first and a second host computer for the writing of multiple copies of records received by said system over any of said paths from either of said host computers, said system comprising:
- a first and a second data storage control connected via separate ones of said channel interface paths to each of said host computers,
- a first group of disk drives connected to said first data storage control and a second group of disk drives connected to said second data storage control,
- a direct data link transmission path devoid of switching means interconnecting said data storage controls,
- means in each of said data storage controls for receiving a data record from either of said host computers over said paths,
- means unique to each data storage control and operable independently of the other data storage control and responsive to the reception of a data record over one of said paths for effecting the writing of said record by a disk drive of the group to which said each data storage control receiving said record is connected,
- means in said each data storage control responsive to the receipt of said record over one of said paths for transmitting said record over said data link transmission path to the other one of said data storage controls, and
- means unique to said other data storage control and operable independently of the other data storage control and responsive to the reception of said record over said data link transmission path for effecting the writing of said record by a disk drive of the group to which said other data storage control is connected.

20. The system of claim 19 wherein each of said data storage controls contains a cache memory,
- means in each data storage control responsive to the receipt of said record over an interface path for entering said received record into the cache memory of each of said data storage controls,
- means for returning a command complete signal to said host computer from the data storage control that receives a record over an interface path when said received record is entered into said cache memory of each of said data storage controls, and
- wherein said means for effecting the writing of said received record comprises means for applying said record in each cache memory to a disk drive connected to the data storage control containing said each cache memory to control the writing of said record by said disk drive of each data storage control.

21. The system of claim 19 wherein a command complete signal is returned by said first data storage control to said host computer after said record is written by a drive in each of said groups of disk drives.

22. In a data storage system adapted to be connected over channel interface paths to a first and a second host computer for the writing of multiple copies of records received by said system over any of said paths from either of said host computers, said system comprising:
- m independently operable data storage controls connected via separate ones of said channel interface paths to each of said host computers,
- m groups of disk drives each group of which is individual to and connected to a different one of said data storage controls,
- a plurality of direct data link transmission paths devoid of switching means interconnecting said data storage controls wherein each data link transmission path interconnects a unique pair of said data storage controls and wherein each of said data storage controls is connected by one of said data link transmission paths to another one of said data storage controls, means in each of said data storage controls for receiving a data record over one of said paths from either of said host computers, means in each data storage control responsive to the receipt of a data record over one of said paths for effecting the writing of said record by a disk drive of the group to which said each data storage control receiving said record is connected, means in said each data storage control responsive to the receipt of said record over one of said paths for transmitting said record over the one of said data link transmission paths connected to said each data storage control to the other one of said data storage controls that is connected to said last named data link transmission path, means in said other data storage control responsive to the receipt of said record over said data link transmission path for effecting the writing of said record received over said data link transmission path by a disk drive of the group to which said other one data storage control is connected, and means in said other data storage control for extending said received record over another one of said data link transmission paths to which said other data storage control is connected to another one of said data storage controls for the writing of said record by a disk drive of the group to which said last named data storage control is connected.

23. In a data storage system adapted to be connected over channel interface paths to a first and a second host computer for the writing of multiple copies of records received by said system over any of said paths from either of said host computers, said system comprising:

m data storage controls connected via separate ones of said channel interface paths to each of said host computers, m groups of disk drives each group of which is individual to and connected to a different one of said data storage controls, a plurality of direct data link transmission paths devoid of switching means interconnecting said data storage controls wherein each data link transmission path interconnects a unique pair of said data storage controls and wherein each of said data storage controls is connected over one of said links to another one of said data storage controls, means in each data storage control for receiving channel program command sequences from one of said host computers over one of said interface paths with each sequence requesting the control of functions by said each data storage control, means in said each data storage control responsive to the receipt of each program command sequence comprising a record write request and an accompanying record for effecting the writing of a said accompanying record by a disk drive of the group connected to said each data storage control, means in said each data storage control for receiving a command sequence over an interface path from said host computer requesting multiple copy service for a subsequently received write request and accompanying record directed to a specified one of said disk drives of said group connected to said each data storage control, wherein said last named command sequence also specifies a disk drive in each of said n groups that is to be used to write multiple copies of a received record for a subsequently received write request directed to said specified one drive of said group connected to said each data storage control, means in said each data storage control responsive to the subsequent receipt of a command sequence comprising a record write request and an accompanying record directed to said specified one drive of said group connected to said each data storage control for transmitting said accompanying record over a data link transmission path to a data storage control connected by said link to said each data storage control, means in said each data storage control further responsive to the receipt of said subsequently received record write request and said accompanying record directed to said specified one disk drive of said group connected to said each data storage control for effecting the writing of said received record by said specified one disk drive of said group connected to said each data storage control, means in said data storage control connected by said link to said each data storage control responsive to the receipt of said record over said data link transmission path for effecting the writing of said record by said specified disk drive to which said last named data storage control is connected, and means in said data storage control connected by said link to said each data storage control responsive to the receipt of said record over said data link transmission path for extending said received record over another one of said data link transmission paths to another one of said data storage controls for both controlling the writing of said record on a specified disk drive connected to said other data storage control and for further extending said record over a data link transmission path to another data storage control so that each other of said data storage controls receives said record over a data link transmission path and controls the writing of said record on a disk drive connected to said each other data storage control.

24. In a data storage system adapted to be connected to a host computer, said system comprising:

m data storage controls, m disk drives each of which is connected to a different one of said data storage controls, a plurality of data link transmission paths each of which interconnects a different pair of said data storage controls, means in a first one of said data storage controls for receiving a data record from said host computer, means unique to said first data storage control and operable independently of each other data storage control and responsive to the reception of said record for effecting the writing of said record by a first disk drive connected to said first data storage control, means in said first data storage control further responsive to the receipt of said record for transmitting said record over a data link transmission path interconnecting said first data storage control and a second data storage control, means unique to said second data storage control and operable independently of each other data storage control and responsive to the reception of said record over said data link transmission path for effecting the writing of said record by a second disk drive connected to said second data storage control, and means in said second data storage control further responsive to said receipt of said record for extending said record over a data link transmission path to another one of said data storage controls so that each other one of said data storage controls receives said record and controls the writing of said record by a disk drive connected to each other one of said data storage controls.

25. In a data storage system adapted to be connected to a host computer, said system comprising:

a first and a second data storage control, a first group of disk drives connected to said first data storage control and a second group of disk drives connected to said second data storage control, a data link transmission path interconnecting said first data storage control and said second data storage control, said data link transmission path comprising a direct path devoid of a switching node, a channel interface path interconnecting said host computer and said first data storage control, means in said first data storage control for receiving channel program command sequences over said interface path requesting the control of functions by said first data storage control including the writing of data records by said first group of disk drives, means unique to said first data storage control and operable independently of said second data storage control and responsive to the receipt of each program command sequence comprising a record write request and an accompanying record for effecting the writing of a said accompanying record by a disk drive of said first group as specified by said received write request, means in said first data storage control for receiving a command sequence from said host computer requesting multiple copy service for a subsequently received write request directed to a specified one of said disk drives of said first group, wherein said last named command sequence specifies a disk drive of each of said first and second groups that is to be used to write said multiple copies of an accompanying record for each subsequently received write request directed to said specified one drive of said first group, means in said first data storage control responsive to the subsequent receipt of a command sequence comprising a record write request and an accompanying record directed to said specified one drive of said first group for transmitting said accompanying record over said data link transmission path to said second data storage control, means unique to said first data storage control operable independently of said second data storage control and further responsive to the receipt of said subsequently received record write request and an accompanying record directed to said specified one disk drive of said first group for effecting the writing of said received record by said specified one disk drive of said first group, and means unique to said second data storage control and operable independently of said first data storage control and responsive to the receipt of said record over said data link transmission path for effecting the writing of said record by said specified disk drive of said second group.

26. The system of claim 25 wherein said channel program command sequence comprises:

commands arranged according to a predetermined channel program command format with at least some of said commands having a parameter list associated therewith and at least one of said commands having an information block associated therewith, said parameter lists and said information block being adapted to contain data arranged into either a first or a second data format, said parameter list and said information block being in a first format when a received channel program command sequence comprises a request for the subsequent provision of multiple copy service for records subsequently written to said specified one disk drive of said first group of disk drives, said parameter list being in a second format when a received command sequence comprises a record write request.

27. The system of claim 26 wherein said system further comprises;

a third data storage control connected to a third group of disk drives and wherein said command sequence requesting multiple copy service further specifies a drive of said third group of disk drives, said system further comprising;

a second data link transmission path connecting said second data storage control with said third data storage control, means in said second data storage control responsive to the receipt of said record over said data link transmission path from said first data storage control for transmitting said record over said second data link transmission path to said third data storage control, and means in said third data storage control and operable independently of said first and second data storage control and responsive to the receipt of said record for effecting the writing of said record by said specified disk drive of said third group.

28. The system of claim 26 wherein said system further comprises:

a cache memory in each of said data storage controls, means in each data storage control responsive to the receipt of a record by said each data storage control for entering said received record into the cache memory of said each data storage control, means for returning a command complete signal said to said host computer from said first data storage control when each record received by each data storage control is entered into said cache memory of said each data storage control, and wherein said means for effecting the writing of each of said records comprises means for applying each record in a cache memory to a disk drive connected to the data storage control containing said cache memory.

29. The system of claim 26 wherein a command complete signal is returned by said first data storage control to said host computer after said record is written by each of said disk drives.

30. The system of claim 26 wherein said system further comprises:

a second channel interface path extending from said host computer to said second data storage control for the transmission of channel program command sequences to said second data storage control, means in said second data storage control for receiving channel program command sequences over said interface path requesting the control of functions by said second data storage control including the writing of data records by said second group of disk drives, means in said second data storage control responsive to the receipt of each program command sequence comprising a record write request for effecting the writing of a record accompanying said request by a disk drive of said second group as specified by said received write request, means in said second data storage control for receiving a command sequence from said host computer requesting multiple copy service for subsequently received record write requests directed to a specified one of said disk drives of said second group, wherein said last named command sequence specifies a disk drive of each of said first and second groups that is to be used to write said multiple copies of records for subsequently received write requests to said specified one disk drive of said second group, means in said second data storage control responsive to the subsequent receipt of a command sequence comprising a record write request directed to said specified one disk drive of aid second group for transmitting said record over said data link transmission path to said first data storage control, means in said second data storage control further responsive to the receipt of said subsequently received record write request to said specified one disk drive of said second group for effecting the writing of said record by said specified one disk drive of said second group, and means in said first data storage control responsive to the receipt of said record over said data link transmission path from said second data storage control for effecting the writing of said record by said specified disk drive of said first group.

31. In a data storage system adapted to be connected over channel interface paths to a first and a second host computer for the writing of duplicate copies of record received by said system over any of said paths from either of said host computers, said system comprising:

a first and a second data storage control connected via separate ones of said channel interface paths to each of said host computers, a first group of disk drives connected to said first data storage control and a second group of disk drives connected to said second data storage control, a direct data link transmission path interconnecting said data storage controls, means in each of said data storage controls for receiving data record write requests from either of said host computers over said paths, means in each data storage control and operable independently of the other storage control and responsive to the receipt of each data record write request over one of said paths for effecting the writing of a data record accompanying said request by a disk drive to which said each data storage control is connected, means in each of said data storage controls for receiving a request from said host computer for the provision of multiple copy service upon the subsequent receipt of a record write request directed to a specified one disk drive of said group connected to said each data storage control, means in each of said data storage controls operable independently of the other data storage control and responsive to the subsequent receipt of a write request directed to said specified one disk drive for controlling the writing of a data record accompanying said request by the specified one disk drive connected to said each data storage control and for transmitting said record over said data link transmission path to the other one of said data storage controls, and means in said other data storage control responsive to the receipt of said record over said data link transmission path for effecting the writing of said record by a specified one of said disk drive to which said other one data storage control is connected.

32. A method of operating a data storage system adapted to be connected to a host computer, said system comprising:

a first independently operable data storage control, a second independently operable data storage control, a first recording means comprising a plurality of different recording elements connected to said first data storage control and a second recording means comprising a plurality of different recording elements connected to said second data storage control, and each of said data storage controls being operable independently of each other to effect the writing of a data record by a specified one of the plurality of recording elements to which each said data storage control is connected, a data link transmission path interconnecting said first and second data storage controls, said method comprising the steps of:

operating said first data storage control for receiving a command from said host computer requesting that an accompanying data record for each subsequent data record write request directed to a first recording element of said first recording means be written by said first recording element of said first recording means and by a first recording element of said second recording means, operating said first data storage control for receiving from said host computer a write request and an accompanying data record requesting that said accompanying data record be written by a specified recording element of said first recording means, operating said first data storage control independently of said second data storage control and in response to the receipt of said write request and accompanying data record for effecting the writing of said data record by said specified recording element of said first recording means, operating said first data storage control in further response to the receipt of said write request and said accompanying data record when said specified recording element of said first recording means comprises said first recording element of said first recording means for transmitting said write request and said accompanying data record over said data link transmission path to said second data storage control, and operating said second data storage control independently of said first data storage control and in response to the receipt of said write request and accompanying data record over said data link transmission path for effecting the writing of said data record by said first recording element of said second recording means.

33. The method of claim 32 wherein said data link transmission path comprises a direct connection between said first and second data storage controls that is devoid of switching means.

34. The method of claim 32 in combination with the additional steps of:
  operating said second data storage control in response to the receipt of said write request and accompanying data record over said data link transmission path for transmitting said write request and accompanying data record over a second data link transmission path to a third data storage control, and
  operating said third data storage control independently of said first and second data storage control and in response to the receipt of said write request and accompanying data record over said second data link transmission path for effecting the writing of said data record by a first recording element of a third recording means connected to said third data storage control.

35. The method of claim 32 wherein said method further includes the steps of:
  operating each data storage control in response to the receipt of said write request and accompanying data record by said each data storage control for entering said received data record into a cache memory of said each data storage control,
  returning a command complete signal to said host computer from said first data storage control when said data record is entered into said cache memory of said each data storage control, and
  wherein said step of effecting the writing of said data record comprises the step of applying said data record in each cache memory to the recording means connected to the data storage control containing said each cache memory to control the writing of said record by said first recording element of said recording means of said each data storage control.

36. The method of claim 32 wherein a command complete signal is returned by said first data storage control to said host computer after said record is written by said first recording element of each of said recording means.

37. The method of claim 32 wherein said first data storage control receives said write request and accompanying data record over a first path extending from said host computer to said first data storage control; said method further comprises the steps of:
  transmitting information including write requests and accompanying data records from said host computer to said second data storage control over a second path extending from said host computer to said second data storage control, and
  operating said second data storage control independently of said first data storage control in response to the receipt of write requests and accompanying data records over said second path to effect the writing by said first recording element of said second recording means of said data records received over said second path.

38. The method of claim 37 wherein said data link transmission path comprises a direct connection between said first and second data storage controls that is devoid of switching means.

39. The method of claim 37 in combination with the steps of:
  further operating second data storage control in response to said receipt of said write requests and accompanying data records received over said second path for transmitting said write requests and accompanying data records over said data link transmission path to said first data storage control, and
  operating said first data storage control independently of said second data storage control and in response to said receipt of said data records over said data link transmission path to effect the writing by said first recording element of said first recording means of said records received by said first data storage control over said data link transmission path.

40. The method of claim 39 wherein said data link transmission path comprises a direct connection between said first and second data storage controls that is devoid of switching means.

41. The method of claim 39 wherein said method further comprises the steps of:
  operating each data storage control in response to the receipt over said path connected to said data storage control of a write request and accompanying data record for entering said data record into a cache memory of said data storage control that received said data record over said path,
  returning a command complete to said host computer from the data storage control that received said data record from said host computer when said record is entered into said cache memory of each data storage control, and
  wherein said step of effecting the writing of said data record comprises the step of applying said data record in each cache memory to the recording means connected to the data storage control containing said each cache memory to control the writing of said record by said recording means.

42. The method of claim 39 wherein said method further includes the step of:
  returning a command complete signal to said host computer from a data storage control that receives a data record from said host computer after said record is written by each of said recording elements of each of said recording means.

43. A method of operating a data storage system adapted to be connected to a host computer, said system including a first independently operable data storage control and a second independently operable data storage control, said method comprising the steps of:
  operating said first data storage control independently of said second data storage control and in response to the receipt from said host computer of a received data record write request and an accompanying data record for effecting the writing of said accompanying data record by a first group of disk drives connected to said first data storage control,
  operating said first data storage control for receiving a command sequence from said host computer requesting that multiple record copies be written for subsequently received record write request directed to a specified one of said disk drives of said first group, operating said first data storage control in response to the subsequent receipt of a record write request and an accompanying data record directed to said specified one disk drive for transmitting said received record associated with said request over a data link transmission path to said second data storage control, further operating said first data storage control independently of said second data storage control and in response to said subsequent receipt of a record write request directed to said specified one disk drive of said first group for effecting the writing of said received record by said specified one disk drive of said first group of disk drives, and operating said second data storage control independently of said first data storage control and in response to the receipt of said record over said data link transmission path for effecting the writing of said record by a disk drive of a second group of disk drives connected to said second data storage control.

44. The method of claim 43 wherein said data link transmission path comprises a direct connection between said data storage controls that is devoid of switching means.

45. The method of claim 43 in combination with the steps of:

operating said second data storage control in response to the receipt of said record for transmitting said record over a second data link transmission path to a third data storage control, and operating said third data storage control independently of said first data storage control and said second data storage control and in response to the receipt of said record for effecting the writing of said record by a disk drive of a third group of drives connected to said third data storage control.

46. The method of claim 43 wherein said method further comprises the steps of:

operating each data storage control in response to the receipt of a record by said each data storage control for entering said each received record into a cache memory of said each data storage control, returning a command complete signal to said host computer from aid first data storage control when a record received by each data storage control is entered into said cache memory of said each data storage control, and wherein said step of effecting the writing of each of said records comprises the step of applying a record in each cache memory to the disk drive connected to the data storage control containing said each cache memory to control the writing of said record by said disk drive.

47. The method of claim 43 in combination with the step of:

returning a command complete signal to said host computer from a data storage control that receives a record from said host computer after said record is written by each of said disk drives.

48. The method of claim 43 wherein said first data storage control receives said record over a first path extending from said host computer to said first data storage control for the reception of information including a data record from said host computer; said method further comprising the steps of:

transmitting information including a data record to said second data storage control over a second path extending from said host computer to said second data storage control, operating said second data storage control for receiving a data record write request from said host computer over said second path, operating said second data storage control independently of said first data storage control and in response to the receipt of each received data record write request and an accompanying data record for effecting the writing of said data record by said second group of disk drives, operating said second data storage control for receiving a command sequence from said host computer requesting that multiple record copies be written for subsequently received data record write requests directed to a specified one of said disk drives of said second group of disk drives, operating said second data storage control in response to the subsequent receipt of a data record write request and accompanying data record directed to said specified one disk drive of said second group for transmitting said received record over said data link transmission path to said first data storage control, further operating said second data storage control independently of said first data storage control and in response to said subsequent receipt of said record write request and accompanying data record for effecting the writing of said received record by said specified one disk drive of said second group of disk drives, and operating said first data storage control independently of said second data storage control and in response to the receipt of said record over said data link transmission path for effecting the writing of said record by a disk drive of said first group of disk drives.

49. The method of claim 48 wherein said method further comprises the steps of:

operating each data storage control in response to the receipt of a record by said each data storage control for entering said received record into a cache memory of said each data storage control, returning a command complete signal to said host computer from said data storage control that receives a record from said host computer when said record is entered into said cache memory of said each data storage control, and wherein said step of effecting a writing of each record comprises the step of applying a record in each cache memory to the disk drive connected to the data storage control containing said each cache memory to control the writing of said record by said disk drive.

50. A method of operating a data storage system adapted to be connected over channel interface paths to a first and a second host computer for the writing of multiple copies of records received by said system over any of said paths from either of said host computers, said method comprising the steps of:

operating a first and a second data storage control for receiving a data record from either of said host computers over one of said interface paths, operating each data storage control independently of the other data storage control in response to the receipt of a data record over one of said paths for effecting the writing of said record by a disk drive of a group of drives to which only said each data storage control receiving said record is connected, operating said each data storage control in response to the receipt of said record over one of said paths for transmitting said record over a data link transmission path to the other one of said data storage controls, and operating said other data storage control independently of the other data storage control and in response to the receipt of said record over said data link transmission path for effecting the writing of said record by a disk drive of a group to which only said other one data storage control is connected.

51. The method of claim 50 wherein said method further comprises the steps of:

operating each data storage control in response to the receipt of said record over an interface path for entering said received record into a cache memory of each of said each data storage control, returning a command complete signal to said host computer from the data storage control that receives a record over a path when said received record is entered into said cache memory of each of said data storage controls, and wherein said step of effecting the writing of said received record comprises the step of applying said record in each cache memory to a disk drive of a group connected to the data storage control containing said each cache memory to control the writing of said record by said disk drive of a group connected to said each data storage control.

52. The method of claim 50 wherein said method further comprises the step of:

returning a command complete signal to said host computer from said first data storage control after said record is written by a drive in each of said groups of disk drives.

53. A method of operating a data storage system containing a plurality of data storage controls and adapted to be connected over channel interface paths to a first and a second host computer for the writing of multiple copies of records received by said system over any of said paths from either of said host computers, said method comprising the steps of:

operating each data storage control independently of each other data storage control in response to the receipt of a data record over one of said paths from either of said host computers for effecting the writing of said record by a disk drive of a group of drives to which only said each data storage control receiving said record is connected, operating said each data storage control in response to the receipt of said record over one of said paths for transmitting said record over a data link transmission path to another one of said data storage controls, operating said other data storage control independently of each other data storage control in response to the receipt of said record over said data link transmission path for effecting the writing of said record by a disk drive of a group of drives to which only said other one data storage control is connected, and operating said other data storage control for extending said received record over another data link transmission path to a third one of said data storage controls for the writing of said record by a disk drive of a group of drives to which only said third data storage control is connected.

54. A method of operating a data storage system adapted to be connected over channel interface paths to a first and a second host computer for the writing of multiple copies of records received by said system over any of said paths from either of said host computers, said method comprising the steps of:

operating each of m data storage controls for receiving from one of said host computers channel program command sequences over one of said interface paths requesting the control of functions by said each data storage control including the writing of data records by a group of disk drives individual to and connected to said each data storage control, operating said each data storage control independently of each other data storage control and in response to the receipt of each program command sequence comprising a record write request and an accompanying record for effecting the writing of said accompanying record by a specified disk drive of the group of disk drives connected to said each data storage control with said disk drive being specified by said received write request, operating said each data storage control for receiving over an interface path a command sequence from said host computer requesting multiple copy service for a subsequently received write request and accompanying record directed to a specified one of said disk drives of said group of disk drives connected to said each data storage control, wherein said last named command sequence also specifies a disk drive in each of a group of n drives that is to be used to write multiple copies of a received record for a subsequently received write request directed to said specified one drive of said group connected to said each data storage control, operating said each data storage control in response to the subsequent receipt of a command sequence comprising a record write request and an accompanying record directed to said specified one drive of said group connected to said each data storage control for transmitting said accompanying record over a data link transmission path to another data storage control connected by said data link to said each data storage control, further operating said each data storage control independently of each other data storage control and in response to the receipt of said subsequently received record write request and said accompanying record directed to said specified one disk drive of said group connected to said each data storage control for effecting the writing of said received record on said specified one disk drive of said group connected to said each data storage control, operating the one of said data storage controls connected by said data link to said each data storage control independently of each other data storage control and in response to the receipt of said record over said data link transmission path for effecting the writing of said record by a specified disk drive of said group connected to said one data storage control, and operating said one data storage control connected by said link to said each data storage control independently of each other data storage control and in response to the receipt of said record over said data link transmission path for extending said received record over another data link transmission path to a third one of said data storage controls for both controlling the writing of said record on a specified disk drive connected to said third data storage control and for further extending said record over a data link transmission path to another data storage control so that each remaining one of said data storage controls receiving said record over a data link transmission path controls the writing of said record by a disk drive connected to said each remaining data storage control.

55. A method of operating a data storage system adapted to be connected to a host computer, said method comprising the steps of:

operating a first one of m data storage controls independently of each other data storage control and in response to the receipt of a record from said host computer for effecting the writing of said record by a first disk drive connected to said first data storage control, operating said first data storage control in response to the receipt of said record for transmitting said record over a data link transmission path to a second data storage control, operating said second data storage control independently of each other data storage control and in response to the receipt of said record for effecting the writing of said record by a second disk drive connected to said second data storage control, and further operating said second data storage control in response to said receipt of said record for extending said record over a data link transmission path to other data storage controls so that said other data storage controls each receive said record and control the writing of said record by a disk drive connected to said other data storage controls.

56. A method of operating a data storage system having a first and a second data storage control and adapted to be connected to a host computer, said method comprising the steps of:

operating said first data storage control independently of said second data storage control for receiving channel program command sequences over an interface path from said host computer requesting the control of functions by said first data storage control including the writing of data records by a first group of disk drives connected to said first data storage control, operating said first data storage control independently of said second data storage control and in response to the receipt of each program command sequence comprising a record write request and an accompanying record for effecting the writing of said accompanying record by a disk drive of said first group, operating said first data storage control for receiving a command sequence from said host computer requesting multiple copy service for a subsequently received write request directed to a specified one of said disk drives of said first group, wherein said last names command sequence specifies a disk drive of each of said first and a second group of drives connected to said second data storage control that is to be used to write said multiple copies of a record accompanying a subsequently received write request and directed to said specified one drive of said first group, operating said first data storage control in response to the subsequent receipt of a command sequence comprising a record write request and an accompanying record directed to said specified one drive of said first group for transmitting said accompanying record over a data link transmission path to said second data storage control, further operating said first data storage control independently of said second data storage control and in response to the receipt of said subsequently received record write request and an accompanying record directed to said specified one disk drive of said first group for effecting the writing of said received record by said specified one disk drive of said first group, and operating said second data storage control independently of said first data storage control and in response to the receipt of said record over said data link transmission path for effecting the writing of said record by said specified disk drive of said second group.

57. The method of claim 56 wherein said channel program command sequence comprises:

commands arranged according to a predetermined channel program command format with at least some of said commands having a parameter list associated therewith and at least one of said commands having an information block associated therewith, said parameter lists and said information block being adapted to contain data arranged into either a first or a second data format, said parameter list and said information block data being in a first format when a received channel program command sequence comprises a request for the subsequent provision of multiple copy service for records subsequently written to said specified one disk drive of said first group of disk drives, said parameter list being in a second format when a received command sequence comprises a record write request.

58. The method of claim 57 wherein said method further comprises the steps of:

operating said second data storage control in response to the receipt of said record for transmitting said record over a second data link transmission path to a third data storage control, and operating said third data storage control independently of said first data storage control and said second data storage control and in response to the receipt of said record for effecting the writing of said record by a disk drive of a third group of disk drives connected to said third data storage control.

59. The method of claim 57 wherein said method further comprises the steps of:

operating each data storage control in response to the receipt of a record by said each data storage control for entering said received record into a cache memory of said each data storage control, returning a command complete signal said to said host computer from said first data storage control when each record received by a data storage control is entered into said cache memory of each data storage control, and wherein said step of effecting the writing of each of said records comprises the step of applying each record in a cache memory to the disk drive connected to the data storage control containing each cache memory.

60. The method of claim 57 wherein said method further comprises the steps of:
returning a command complete signal from said first data storage control to said host computer after said record is written by each of said disk drives.

61. The method of claim 57 wherein said method further comprises the steps of:
transmitting channel program command sequences to said second data storage control over a second channel interface path extending from said host computer to said second data storage control,
operating said second data storage control for receiving channel program command sequences over said interface path from said host computer requesting the control of functions by said second data storage control including the writing of data records by said second group of disk drives,
operating said second data storage control independently of said first data storage control and in response to the receipt of each program command sequence comprising a record write request for effecting the writing of a record accompanying said request by a disk drive of said second group as specified by said received write request,
operating said second data storage control for receiving a command sequence from said host computer requesting multiple copy service for subsequently received record write requests directed to a specified one of said disk drives of said second group, wherein said last named command sequence specifies a disk drive of each of said first and second groups that is to be used to write said multiple copies of records for subsequently received write requests to said specified one drive of said second group,
operating said second data storage control in response to the subsequent receipt of a command sequence comprising a record write request and an accompanying data record directed to said specified one disk drive of said second group of disk drives for transmitting said accompanying record over said data link transmission path to said first data storage control,
further operating said second data storage control independently of said first data storage control and in response to the receipt of said subsequently received record write request and an accompanying data record directed to said specified one disk drive of said second group of disk drives for effecting the writing of said accompanying record by said specified one disk drive of said second group of disk drives, and
operating said first data storage control independently of said second data storage control and in response to the receipt of said record over said data link transmission path for effecting the writing of said record by said specified disk drive of said first group of disk drives.

62. A method of operating a data storage system adapted to be connected over channel interface paths to a first and a second host computer for the writing of duplicate copies of record received by said system over any of said paths from either of said host computers, said system comprising:
operating each of a first and a second data storage control for receiving a data record from either of said host computers over said paths,
operating said each data storage control independently of the other data storage control and in response to the receipt of each write request and an accompanying data record over a path from said host computer for effecting the writing of said accompanying record by a disk drive of a group to which said each data storage control is connected,
operating each of said data storage controls for receiving a request from said host computer for the provision of multiple copy service upon the subsequent receipt of a record write request directed to a specified one disk drive of a group connected to said each data storage control,
operating each of said data storage controls independently of the other data storage control and in response to the subsequent receipt of a write request and an accompanying data record directed to said specified one disk drive for controlling the writing of said accompanying record by the specified drive connected to said each data storage control and for transmitting said record over said data link transmission path to the other one of said data storage controls, and
operating said other data storage control independently of the other data storage control and in response to the receipt of said record for effecting the writing of said record by the one of said disk drives to which said other one data storage control is connected.

63. A method of operating a data storage system adapted to be connected over first and second channel interface paths, respectively, to a first and a second host computer, respectively, for the writing of a single copy of records received by said system over any of said paths from either of said host computers, said method comprising the steps of:
operating a first data storage control for receiving a data record write request and an accompanying data record over said first path from said first host computer,
operating a second data storage control for receiving a data record write request and an accompanying data record over said second path from said second host computer, and
operating each data storage control in response to the receipt of each write request by said each data storage control for effecting the writing of the data record accompanying each request by only a disk drive to which said second data storage control is connected.

64. The method of claim 63 wherein said data storage controls are interconnected by a direct data link transmission path and wherein said method further comprises the steps of:
operating said first data storage control in response to said write request from said host computer for transmitting said record accompanying said request over said data link transmission path to said second data storage control, and
operating said second data storage control in response to the receipt of said record over said data link transmission path for writing said record on said disk drive to which said second data storage control is connected.

65. The method of claim 64 in combination with the additional steps of:
- operating said second data storage control in response to a receipt of a record read request from said second host computer for reading said record by said disk drive to which said second data storage control is connected,
- transmitting said read record over said second channel interface path to said second host computer,
- operating said first data storage control in response to a receipt of a record read request from said first host computer for receiving said record from said second data storage control over said data link transmission path, and
- transmitting said record received over said data link transmission path to said first host computer from said first data storage control over said first channel interface path.

66. A method of operating a data storage system adapted to be connected over first and second channel interface paths, respectively, to a first and a second host computer, respectively, for the writing of a single copy of records received by said system over any of said paths from either of said host computers, said method comprising the steps of:
- operating a first data storage control for receiving a data record write request and an accompanying data record over said first path from said first host computer,
- operating a second data storage control for receiving a data record write request and an accompanying data record over said second path from said second host computer,
- operating said second data storage control in response to the receipt of each write request from said second host computer and directed to a specified disk drive connected to said second data storage control for effecting the writing of said record accompanying each request by said specified disk drive to which said second data storage control is connected,
- operating said first data storage control for receiving a request from said first host computer for the provision of shared service upon the subsequent receipt of a record write request and an accompanying data record directed to a specified phantom drive of a group of disk drives connected to said first data storage control,
- operating said first data storage control in response to the subsequent receipt of each write request and an accompanying data record not directed to said phantom drive of said first data storage control for effecting the writing of the record accompanying each request by a disk drive of a group to which said first data storage control is connected,
- operating said first data storage control in response to the subsequent receipt of a write request and an accompanying data record directed to said specified phantom disk drive for transmitting said record over a data link transmission path to said second data storage control, and
- operating said second data storage control in response to the receipt of said record over said data link transmission path for effecting the writing of said record by a disk drive to which said second data storage control is connected.

67. A method of operating a data storage system adapted to be connected to a first and a second host computer for the sharing of records by users of both of said computers, said method comprising the steps of:
- operating a first data storage control for receiving channel program command sequences over a first interface path from said first host computer requesting the control of system functions by said first data storage control including the writing and reading of data records by a first group of disk drives connected to said first data storage control,
- operating said first data storage control in response to the receipt from said first host computer of each program command sequence comprising a record write request and an accompanying data record for effecting the writing of a said accompanying data record by a disk drive of said first group as specified by said received write request,
- operating a second data storage control for receiving channel program command sequences over a second interface path from said second host computer requesting the control of functions by said second data storage control including the writing and reading of data records by a second group of disk drives connected to said second data storage control,
- operating said second data storage control in response to the receipt from said second host computer of each program command sequence comprising a data record write request and an accompanying data record for effecting the writing of said accompanying data record by a disk drive of said second group as specified by said write request received by said second data storage control,
- operating said first data storage control for receiving a command sequence from said first host computer requesting the establishment of extended connectivity service for subsequently received write requests directed to a specified phantom disk drive of said first group, wherein said last named command sequence also specifies a disk drive of said second group of drives that is to be used to write a copy of a received record accompanying each subsequently received write request directed to said specified phantom drive of said first group,
- operating said first data storage control in response to a subsequent receipt of a command sequence comprising a record write request and an accompanying data record directed to said specified phantom drive of said first group of drives for transmitting said accompanying data record over a direct data link transmission path to said second data storage control, and
- operating said second data storage control in response to the receipt of said record over said data link transmission path for effecting the writing of said data record by said specified disk drive of said second group.

68. The method of claim 67 in combination with the additional steps of:
- operating said first data storage control in response to a subsequent receipt of a command sequence comprising a record read request directed to said specified phantom drive of said first group for transmitting a message containing said read request over said direct data link transmission path to said second data storage control, operating said second data storage control in response to the receipt of said record read request over said data link transmission path for effecting the reading of said requested data record by said specified disk drive of said second group containing said requested record, transmitting said read data record over said data link transmission path from said second data storage control to said first data storage control, operating said first data storage control in response to the receipt of said data record over said data link transmission path from said second data storage control for transmitting said data record over said first interface path to said first host computer, operating said second data storage control in response to a subsequent receipt from said second host computer of a command sequence comprising a data record read request directed to a specified drive of said second group for reading said data record from said specified drive of said second group, and transmitting said read data record over said second interface path to said second host computer.

69. The method of claim 67 wherein said channel program command sequence requesting the establishment of extended connectivity service comprises:

commands arranged according to a predetermined channel program command format with at least some of said commands having a parameter list associated therewith and at least one of said commands having an information block associated therewith, said parameter lists and said information block data being in a first format when a received channel program command sequence comprises a request for the subsequent provision of said extended connectivity service for subsequently received write requests directed to said specified phantom drive of said first group of disk drives, said parameter list being in a second format when a received command sequence comprises a data record write request.

70. A method of operating a data storage system adapted to be connected to a first and a second host computer, said method comprising the steps of:

operating a first data storage control for receiving channel program command sequences over a first interface path from said first host computer requesting the control of system functions by said first data storage control including the writing and reading of data records by a first group of disk drives connected to said first data storage control, operating said first data storage control in response to the receipt from said first host computer of each program command sequence comprising a record write request and an accompanying data record for effecting the writing of a said accompanying data record by a disk drive of said first group as identified by said received write request, operating a second data storage control for receiving channel program command sequences over a second interface path from said second host computer requesting the control of functions by said second data storage control including the writing and reading of data records by a second group of disk drives connected to said second data storage control, operating said second data storage control in response to the receipt from said second host computer of each program command sequence comprising a record write request and an accompanying data record for effecting the writing of said accompanying data record by a disk drive of said second group as identified by said write request received by said second data storage control, operating said first data storage control for receiving a command sequence from said first host computer requesting the establishment of extended service for subsequently received write requests directed to a specified disk drive of said first group, wherein said last named command sequence also specifies a disk drive of said second group of drives that is to be used to write a copy of a received record accompanying each subsequently received write request directed to said specified disk drive of said first group, operating said first data storage control in response to a subsequent receipt of a command sequence comprising a record write request and an accompanying data record directed to said specified drive of said first group of drives for transmitting said accompanying record over a direct data link transmission path to said second data storage control, operating said second data storage control in response to the receipt of said data record over said data link transmission path for effecting the writing of said record by said specified disk drive of said second group, operating said first data storage control in response to a subsequent receipt of a command sequence comprising a record write request and an accompanying data record directed to said specified drive of said first group of drives for effecting the writing of said record by said specified disk drive of said first group if said specified disk drive of said first group is not a phantom disk drive, and inhibiting the writing of said accompanying record by a disk drive of said first group if said specified disk drive of said first group is a phantom disk drive.

71. A method of operating a data storage system adapted to be connected to a host computer, said method comprising the steps of:

operating a first one of m independently operable data storage controls in response to the receipt of a record from said host computer for effecting the writing of said record by a first disk drive connected to said first data storage control, operating said first data storage control in response to the receipt of said record for transmitting said record over a data link transmission path to a second data storage control, operating said second data storage control independently of said first data storage control in response to the receipt of said record for effecting the writing of said record by a second disk drive connected to said second data storage control, further operating said second data storage control in response to said receipt of said record for extending said record over a data link transmission path to other data storage controls, operating said other data storage controls to receive said record over said data link transmission path, and further operating said other data storage controls independently of each other data storage control so that said record is written by disk drives of less than all of said other data storage controls whereby said system writes less than m copies of said record received from said host computer by said first data storage control.

* * * * *